United States Patent
Derkacs et al.

(10) Patent No.: US 11,784,273 B2
(45) Date of Patent: Oct. 10, 2023

(54) MULTIJUNCTION METAMORPHIC SOLAR CELL

(71) Applicant: SolAero Technologies Corp., Albuquerque, NM (US)

(72) Inventors: Daniel Derkacs, Albuquerque, NM (US); John Hart, Albuquerque, NM (US); Zachary Bittner, Albuquerque, NM (US); Andrew Espenlaub, Albuquerque, NM (US)

(73) Assignee: Sol Aero Technologies Corp., Albuquerque, NM (US)

( * ) Notice: Subject to any disclaimer, the term of this patent is extended or adjusted under 35 U.S.C. 154(b) by 0 days.

(21) Appl. No.: 17/818,296

(22) Filed: Aug. 8, 2022

(65) Prior Publication Data
US 2023/0065274 A1 Mar. 2, 2023

Related U.S. Application Data

(60) Provisional application No. 63/231,683, filed on Aug. 10, 2021.

(51) Int. Cl.
*H01L 31/0687* (2012.01)
*H01L 31/18* (2006.01)
(Continued)

(52) U.S. Cl.
CPC ...... *H01L 31/06875* (2013.01); *H01L 31/054* (2014.12); *H01L 31/0693* (2013.01); *H01L 31/184* (2013.01)

(58) Field of Classification Search
CPC ........... H01L 31/0547; H01L 31/06875; H01L 31/0725; H01L 31/0735; H01L 31/074; H01L 31/1844; H01L 31/1892
See application file for complete search history.

(56) References Cited

U.S. PATENT DOCUMENTS

| | | | |
|---|---|---|---|
| 2018/0240922 A1* | 8/2018 | Derkacs | H01L 31/1852 |
| 2019/0259897 A1* | 8/2019 | France | H01L 31/035236 |

(Continued)

FOREIGN PATENT DOCUMENTS

| | | |
|---|---|---|
| CN | 210 272 385 | 4/2020 |
| CN | 112 466 976 | 3/2021 |
| WO | WO 2019/237155 | 12/2019 |

OTHER PUBLICATIONS

EP Extended Search Report for EP App No. 21203584.4-1230 dated Mar. 16, 2022 (14 pages).
(Continued)

*Primary Examiner* — Mayla Gonzalez Ramos

(57) ABSTRACT

A multijunction solar cell comprising a first solar subcell having a first band gap; a second solar subcell disposed adjacent to said first solar subcell and including an emitter layer, and a base layer having a second band gap less than the first band gap, and being lattice mismatched with the upper first solar subcell, and an intermediate layer directly adjacent to and disposed between first and the second solar subcells and compositionally graded to lattice match the first solar subcell on one side and the second solar subcell on the other side, and arranged so that light can enter and pass through the first solar subcell and at least a portion of which can be reflected back into the first solar subcell by the intermediate layer, and is composed of a plurality of layers of materials with discontinuities in their respective indices of refraction.

19 Claims, 6 Drawing Sheets

(51) Int. Cl.
H01L 31/0693 (2012.01)
H01L 31/054 (2014.01)

(56) References Cited

U.S. PATENT DOCUMENTS

2020/0251603 A1* 8/2020 McGlynn ............ H01L 31/0687
2021/0202777 A1 7/2021 Derkacs

OTHER PUBLICATIONS

France RM et al., "Graded buffer Bragg reflectors with high reflectivity and transparency for metamorphic optoelectronics", Journal of Applied Physics, American Institute of Physics, 2 Huntington Quadrangle, Melville, NY 11747, vol. 129, No. 17, May 4, 2021.

* cited by examiner

MULTIJUNCTION METAMORPHIC SOLAR CELL

REFERENCE TO RELATED APPLICATIONS

This application claims the benefit of U.S. Provisional Patent Application 63/231,683 filed Aug. 10, 2021.

The present application is related to U.S. patent application Ser. No. 16/722,732 filed Dec. 20, 2019 which is a divisional of U.S. patent application Ser. No. 15/681,144 filed Aug. 18, 2017, now U.S. Pat. No. 10,700,230.

The present application is related to U.S. patent application Ser. No. 15/203,975 filed Jul. 7, 2016, and U.S. patent application Ser. No. 15/210,532 filed Jul. 14, 2016.

This application is related to U.S. patent application Ser. No. 14/660,092 filed Mar. 17, 2015, which is a division of U.S. patent application Ser. No. 12/716,814 filed Mar. 3, 2010, now U.S. Pat. No. 9,018,521; which was a continuation in part of U.S. patent application Ser. No. 12/337,043 filed Dec. 17, 2008.

This application is also related to U.S. patent application Ser. No. 13/872,663 filed Apr. 29, 2012 now U.S. Pat. No. 10,541,349, which was also a continuation-in-part of application Ser. No. 12/337,043, filed Dec. 17, 2008.

This application is also related to U.S. patent application Ser. Nos. 14/828,197 and 14/828,206 filed Aug. 17, 2015.

All of the above related applications are incorporated herein by reference in their entirety.

BACKGROUND

Field of the Invention

The present disclosure relates to solar cells and the fabrication of solar cells, and more particularly the design and specification of the metamorphic buffer layer in a four or five junction solar cell based on III-V semiconductor compounds.

Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, and applications anticipated for five, ten, twenty or more years, the power-to-weight ratio and lifetime efficiency of a solar cell becomes increasingly more important, and there is increasing interest not only the amount of power provided at initial deployment, but over the entire service life of the satellite system, or in terms of a design specification, the amount of power provided at a specific future time, often referred to as the "end of life" (EOL).

The efficiency of energy conversion, which converts solar energy (or photons) to electrical energy, depends on various factors such as the design of solar cell structures, the choice of semiconductor materials, and the thickness of each subcell. In short, the energy conversion efficiency for each solar cell is dependent on the optimum utilization of the available sunlight across the solar spectrum as well as the "age" of the solar cell, i.e. the length of time it has been deployed and subject to degradation associated with the temperature and radiation in the deployed space environment. As such, the characteristic of sunlight absorption in semiconductor material, also known as photovoltaic properties, is critical to determine the most efficient semiconductor to achieve the optimum energy conversion to meet customer requirements of intended orbit and lifetime.

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, and photons pass through the subcells, the photons in a wavelength band that are not absorbed and converted to electrical energy in the region of one subcell propagate to the next subcell, where such photons are intended to be captured and converted to electrical energy, assuming the downstream subcell is designed for the photon's particular wavelength or energy band.

The individual solar cells or wafers are then disposed in horizontal arrays, with the individual solar cells connected together in an electrical series and/or parallel circuit. The shape and structure of an array, as well as the number of cells it contains, are determined in part by the desired output voltage and current.

The electrical characteristics of a solar cell, such as the short circuit current ($J_{sc}$), the open circuit voltage ($V_{oc}$), and the fill factor (FF), are affected by such factors as the number of subcells, the thickness of each subcell, the composition and doping of each active layer in a subcell, and the consequential band structure, electron energy levels, conduction, and absorption of each subcell, as well as its exposure to radiation in the ambient environment over time. The overall power output and conversion efficiency of the solar cell are thereby affected in different and often unpredictable ways. Such factors also vary over time (i.e. during the operational life of the system).

The designation and specification of such material parameters is a non-trivial engineering undertaking, and would vary depending upon the specific space mission and customer design requirements. Such design variables are interdependent and interact in complex and often unpredictable ways. Accordingly, it is evident that the consideration of any one material design parameter or variable, such as the amount of a particular constituent element in a layer, and therefore the resulting band gap of that layer, affects each of the electrical characteristics $J_{sc}$, $V_{oc}$ and FF in a different way, sometimes in opposite directions. Thus, such changes do not predictably lead to an increase in power output or solar cell efficiency. Stated another way, focus on any single such material parameter in the design of a multijunction solar cell is not a viable design paradigm or calculus since each variable standing alone is NOT a simple "result effective variable" that can be mindlessly increased or decreased in order to achieve greater power output by those skilled in the art confronted with complex design specifications and practical operational considerations or related design objectives.

To reinforce the above observation, the present disclosure identifies a combination of two electrical parameters associated with a subcell and notes how the value of the combination changes over the generational lifetime of the solar cell, which is different for each subcell (since each subcell has a different band gap).

The electrical parameter of consideration taught by the present disclosure is the difference between the band gap and the open circuit voltage, or $(E_g/q-V_{oc})$, of a particular active layer. The value of such parameter may vary depending on subcell layer thicknesses, doping, the composition of adjacent layers (such as tunnel diodes), and even the specific wafer being examined from a set of wafers processed on a single supporting platter in a reactor run, but consideration of that parameter has led to new design conditions in improving the end-of-life efficiency of a multijunction solar cell.

SUMMARY

Objects of the Disclosure

Some implementations described in the present disclosure achieve one or more of the following objects.

It is an object of the present disclosure to provide increased photoconversion efficiency in a multijunction solar cell for space applications over the operational life of the photovoltaic power system.

It is another object of the present disclosure to provide in a multijunction solar cell in which the selection of the composition of the subcells and their band gaps maximizes the efficiency of the solar cell at a predetermined temperature (in the range of 50 to 100 degrees Centigrade) and radiation environment in deployment in space at AM0 at a predetermined time after the initial deployment referred to as the beginning-of-life or BOL, such time being at least (i) one year; (ii) five years; (iii) tens years; or (iv) fifteen years, and referred to as the end-of-life, or EOL, in a specific orbit or space mission, and the solar cell efficiency at the BOL is less than the solar cell efficiency at the EOL.

It is another object of the present disclosure to provide an upright, tandem four or five junction solar cell with one metamorphic layer in which the average band gap of all four cells is greater than 1.44 eV.

It is another object of the present disclosure to provide a lattice mismatched four junction solar cell in which the current through the bottom subcell is intentionally designed to be substantially greater than current through the top three subcells when measured at the "beginning-of-life" or time of initial deployment.

It is another object of the present disclosure to provide an upright, tandem four or five junction solar cell with an intermediate layer between two adjacent solar subcells which includes a graded DBR structure.

It is another object of the present disclosure to provide an upright, tandem four or five junction solar cell with a DBR layer disposed between the lower two solar subcells.

It is another object of the present disclosure to provide an upright, tandem four or five junction solar cell with an intermediate layer between two lattice mismatched solar subcells with one portion comprising a compositionally graded sequence of lattice mismatched DBR layer pairs and another portion comprising a sequence of lattice matched DBR layer pairs.

It is another object of the present disclosure to provide a distributed Bragg reflector (DBR) structure adjacent to and between two solar subcells and composed of a plurality of alternating layers of lattice matched materials with discontinuities in their respective indices of refraction, with either successive pairs or successive two pairs of the layers being lattice mismatched and compositionally graded.

Some implementations of the present disclosure may incorporate or implement fewer than all of the foregoing objects.

All ranges of numerical parameters set forth in this disclosure are to be understood to encompass any and all subranges or "intermediate generalizations" subsumed therein. For example, a stated range of "1.0 to 2.0 eV" for a band gap value should be considered to include any and all subranges beginning with a minimum value of 1.0 eV or more and ending with a maximum value of 2.0 eV or less, e.g., 1.0 to 1.2, or 1.3 to 1.4, or 1.5 to 1.9 eV.

Briefly, and in general terms, the present disclosure describes, among other things, a four junction solar cell comprising: an upper first solar subcell composed of indium gallium aluminum phosphide and having a first band gap in the range of 1.85 to 2.2 eV (and in some implementations, more specifically in the range of 2.03 to 2.1 eV); a second solar subcell disposed adjacent to said first solar subcell and including an emitter layer composed of indium gallium phosphide or aluminum indium gallium arsenide, and a base layer composed of aluminum indium gallium arsenide and having a second band gap in the range of approximately 1.41 to 1.8 eV (and in some implementations, more specifically in the range of 1.55 to 1.73 eV), being lattice matched with the upper first solar subcell, wherein the emitter and base layers form a photoelectric junction; a third solar subcell adjacent to said second solar subcell and composed of indium gallium arsenide and having a third band gap less than that of the second solar subcell and being lattice matched with the second solar subcell; a fourth solar subcell adjacent to said third solar subcell and composed of germanium and having, for example, a fourth band gap of approximately 0.67 eV; and an intermediate layer directly adjacent to and disposed between the third and the fourth solar subcells and compositionally graded to lattice match the third solar subcell on one side and the fourth solar subcell on the other side, and arranged so that light can enter and pass through the third solar subcell and at least a portion of which can be reflected back into the third solar subcell by the intermediate layer, and is composed of a plurality of layers of materials with discontinuities in their respective indices of refraction and changing between higher and lower indices of refraction in each pair of layers.

In some embodiments, the intermediate layer includes a first portion composed of a plurality DBR layer pairs and a thickness of approximately 140 nm.

In some embodiments, either each successive pair or each successive two pairs have a gradation in lattice constant.

In some embodiments, the intermediate layer includes a second portion disposed over the first portion of the intermediate layer and compose of a plurality of DBR pairs with a constant lattice constant.

In some embodiments, the total number of DBR layer pairs in the intermediate layer is between 10 and 20.

In some embodiments, the intermediate layer includes a first portion composed of a plurality DBR layer pairs with each successive pair having a gradation in lattice constant, and a second portion disposed over the first portion and composed of a plurality of DBR pairs with a constant lattice constant.

In some embodiments, the first portion of the intermediate layer has a smaller number of DBR layer pairs than the second portion of the intermediate layer disposed over the first portion.

In some embodiments, the average band gap of all four subcells is equal to or greater than 1.35 eV where the average band gap of the solar cell is numerical average of the lowest band gap material that is used in each subcell. In some embodiments, the average band gap of all four subcells is equal to or greater than 1.38 eV where the average band gap of the solar cell is numerical average of the lowest band gap material that is used in each subcell.

In some embodiments, the third solar subcell has a band gap in the range of 1.3 to 1.41 eV.

In some embodiments, the difference in refractive indices between the plurality of layers of the intermediate layer is maximized in order to minimize the number of periods required to achieve a given reflectivity, and the thickness and refractive index of each period determines the stop band.

In some embodiments, the solar cell further comprises a tunnel diode disposed over the fourth subcell, with the intermediate layer being disposed between the third subcell and the tunnel diode, wherein the intermediate layer is compositionally graded to lattice match the third solar subcell on one side and the tunnel diode on the other side.

In some embodiments, the first portion of the intermediate layer is compositionally step-graded such that the band gap of the step graded layers of the first portion of the intermediate layer is in the range of 1.15 to 1.41 eV throughout its thickness.

In some embodiments, the first portion of the intermediate layer has a graded band gap in the range of 1.15 to 1.41 eV, or 1.2 to 1.35 eV, or 1.25 to 1.30 eV.

In some embodiments, each solar subcell includes an emitter region and a base region, and one or more of the solar subcells have a base region having a gradation in doping that increases exponentially from $1\times10^{15}$ atoms per cubic centimeter adjacent the p-n junction $4\times10^{18}$ atoms per cubic centimeter adjacent to the adjoining layer at the rear of the base, and an emitter region having a gradation in doping that decreases from approximately $5\times10^{18}$ atoms per cubic centimeter in the semiconductor region immediately adjacent to said adjoining layer to $5\times10^{17}$ atoms per cubic centimeter in the region adjacent to the p-n junction of the solar subcell.

In some embodiments, at least one of the upper sublayers of the second portion of the intermediate layer has a larger lattice constant than the adjacent semiconductor layers to the upper sublayer disposed above the intermediate layer.

In some embodiments, the difference in lattice constant between the adjacent third and fourth solar subcells is in the range of 0.01 to 0.1 Angstroms.

In some embodiments, the solar cell further comprises an inactive majority carrier layer (such as a window, BSF, or tunnel diode layer) disposed over the second or third solar subcell and having a lattice constant that is greater than that of the third and fourth solar subcells so that the tunnel diode layers are strained in tension.

In some embodiments, the solar cell further comprises a threading dislocation inhibition layer having a thickness in the range of 0.10 to 1.0 micron and composed of InGa(Al)P, the threading dislocation inhibition layer being disposed over and directly adjacent to said intermediate layer for reducing the propagation of threading dislocations, said threading dislocation inhibition layer having a composition different from a composition of the intermediate layer.

In Some embodiments, a four junction solar cell is provided such that:
the upper first solar subcell has a band gap of 2.10 eV; the second solar subcell has a bandgap of 1.73 eV; the third solar subcell has a band gap of 1.41 eV; and the fourth solar subcell has a band gap of 0.67 eV;
or
the upper first solar subcell has a band gap of 2.10 eV; the second solar subcell has a bandgap of 1.63 eV; the third solar subcell has a band gap of 1.335 or 1.311 or 1.3 or 1.289 eV; and the fourth solar subcell has a band gap of 0.67 eV;
or
the upper first solar subcell has a band gap of 2.10 eV; the second solar subcell has a bandgap of 1.57 eV; the third solar subcell has a band gap of 1.265 eV; and the fourth solar subcell has a band gap of 0.67 eV;
or
the upper first solar subcell has a band gap of 2.10 eV; the second solar subcell has a bandgap of 1.56 eV; the third solar subcell has a band gap of 1.25 eV; and the fourth solar subcell has a band gap of 0.67 eV;
or
the upper first solar subcell has a band gap of 2.10 eV; the second solar subcell has a bandgap of 1.73 eV; the third solar subcell has a band gap of 1.42 eV; and the fourth solar subcell has a band gap of 0.67 eV;
or
the upper first solar subcell has a band gap of 2.10 eV; the second solar subcell has a bandgap of 1.55 eV; the third solar subcell has a band gap of 1.197 eV; and the fourth solar subcell has a band gap of 0.67 eV;
or
the upper first solar subcell has a band gap of 2.10 eV; the second solar subcell has a bandgap of 1.53 eV; the third solar subcell has a band gap of 1.175 eV; and the fourth solar subcell has a band gap of 0.67 eV;
or
the upper first solar subcell has a band gap of 2.10 eV; the second solar subcell has a bandgap of 1.45 eV; the third solar subcell has a band gap of 1.1 eV; and the fourth solar subcell has a band gap of 0.67 eV.

Other combinations of band gaps may be suitable for some implementations.

In another aspect, the present disclosure provides a multijunction solar cell and its method of fabricating comprising an upper first solar subcell composed of indium gallium aluminum phosphide and having a first band gap a second solar subcell adjacent to said first solar subcell including an emitter layer composed of indium gallium phosphide or aluminum gallium arsenide, and a base layer composed of aluminum gallium arsenide and having a second band gap smaller than the first band gap and being lattice matched with the upper first solar subcell, a third solar subcell adjacent to said second solar subcell and composed of indium gallium arsenide and having a third band gap smaller than the second band gap and being lattice matched with the second solar subcell; and a fourth solar subcell adjacent to said third solar subcell and composed of germanium having a fourth band gap smaller than the third band gap; wherein the selection of the composition of the subcells and their band gaps maximizes the efficiency at high temperature (in range of 50 to 100 degrees Centigrade) in deployment in space at a specific predetermined time after the initial deployment (referred to as the beginning-of-life or BOL), such predetermined time being referred to as the end-of-life (EOL), and being at least three years after the BOL, and does not maximize the efficiency at the BOL. In other words, the efficiency of the solar cell at the EOL is specifically designed to be greater than the efficiency at the BOL. Such optimization is a useful paradigm since the efficiency over long periods of time one, two, or three years or more after the BOL is often more important for some applications than the efficiency at the BOL.

In another aspect, the present disclosure provides a method of manufacturing a multijunction solar cell comprising: providing a growth substrate; forming a first solar subcell in the growth substrate; growing a grading interlayer over the growth substrate, followed by a sequence of layers of semiconductor material using a disposition process to form a solar cell comprising a plurality of subcells including a first middle subcell disposed over and lattice mismatched with respect to the growth substrate and having a band gap in the range of 1.3 to 1.6 eV, at least a second middle subcell disposed over the third subcell and having a band gap in the range of approximately 1.65 to 1.8 eV and an upper subcell disposed over the last middle subcell and having a band gap in the range of 2.0 to 2.20 eV, wherein the graded interlayer is compositionally graded to lattice match the growth substrate on one side and the first middle solar subcell on the other side, and is composed of any of the As, P, N, Sb based III-V compound semiconductors subject to the constraints of having the in-plane lattice parameter throughout its thickness being greater than or equal to that of the growth substrate.

In some embodiments, the upper subcell is composed of indium gallium aluminum phosphide; the third middle solar subcell includes an emitter layer composed of indium gallium phosphide or aluminum gallium arsenide, and a base layer composed of indium aluminum gallium arsenide or an indium gallium arsenide phosphide base and emitter layer, the base layer, and the emitter layer forming a photovoltaic junction; the second middle solar subcell is composed of indium gallium arsenide; the first solar subcell is composed of germanium; and the graded interlayer is composed of $In_xGa_{1-x-y}Al_yAs$ with $0<x<1$, $0<y<1$, and x and y selected such that the band gap remains constant throughout its thickness.

In some embodiments, the band gap of the graded interlayer remains at a constant value in the range of 1.22 to 1.54 eV throughout its thickness.

In some embodiments, a four junction solar cell is provided, the fourth subcell or growth substrate has a band gap of approximately 0.67 eV, the first middle subcell has a band gap in the range of approximately 1.2 to 1.41 eV, the second middle subcell has a band gap in the range of approximately 1.55 to 1.73 eV (or, in some cases, in the range of 1.65 to 1.81 eV), and the upper subcell has a band gap in the range of 2.0 to 2.20. In some cases, the upper middle subcell has a band gap in the range of 2.03 to 2.1 eV.

In some embodiments, the second middle subcell has a band gap of approximately 1.66 eV and the upper subcell has a band gap of approximately 1.95 eV.

In some embodiments, the top subcell is composed of a base layer of $(Al_xGa_{1-x})_{1-y}In_yP$, and an emitter layer of $(Al_xGa_{1-x})_{1-y}In_yP$.

In some embodiments of a five junction solar cell, the bottom subcell or growth substrate is composed of germanium, the first middle subcell is composed of indium gallium arsenide; the second middle solar subcell includes an emitter layer composed of indium gallium phosphide or aluminum indium gallium arsenide, and a base layer composed of aluminum indium gallium arsenide; the third middle solar subcell is composed of (aluminum) indium gallium phosphide; and the upper subcell is composed of aluminum indium gallium phosphide.

In some embodiments of a five junction solar cell, the first solar subcell has a band gap of approximately 0.67 eV, the first middle subcell has a band gap in the range of 1.06 eV to 1.41 eV, the second middle subcell has a band gap in the range of 1.35 to 1.66 eV, but greater than the first middle subcell, the third middle subcell has a band gap in the range of 1.665 to 1.95 eV and the upper subcell has a band gap in the range of 1.95 to 2.20 eV.

In some embodiments, there further comprises providing a distributed Bragg reflector (DBR) structure adjacent to and between the last middle and the bottom solar subcells and composed of a plurality of alternating layers of lattice matched materials with discontinuities in their respective indices of refraction and arranged so that light can enter and pass through the last middle solar subcell and at least a first portion of which light having a first spectral width wavelength range, including the band gap of the last middle solar subcell, can be reflected back into the last middle solar subcell by the DBR structure, and a second portion of which light in a second spectral width wavelength range corresponding to longer wavelengths than the first spectral width wavelength range can be transmitted through the DBR structure to the bottom solar subcell disposed beneath the DBR structure.

In some embodiments, there further comprises providing a distributed Bragg reflector (DBR) structure adjacent to and between the first and second, or the second and the third, middle solar subcells and composed of a plurality of alternating layers of lattice mismatched materials with discontinuities in their respective indices of refraction and arranged so that light can enter and pass through the upper solar subcell and at least a first portion of which light having a first spectral width wavelength range, including the band gap of the upper solar subcell, can be reflected back into the upper solar subcell by the DBR structure, and a second portion of which light in a second spectral width wavelength range corresponding to longer wavelengths that the first spectral width wavelength range can be transmitted through the DBR structure to the lower and further solar subcells disposed beneath the DBR structure.

In some embodiments, there further comprises providing a distributed Bragg reflector (DBR) structure adjacent to and between two adjacent solar subcells and composed of a plurality of alternating layers of lattice matched materials with discontinuities in their respective indices of refraction and arranged so that light can enter and pass through the upper solar subcell and at least a first portion of which light having a first spectral width wavelength range, including the band gap of the upper solar subcell, can be reflected back into the upper solar subcell by the DBR structure, and a second portion of which light in a second spectral width wavelength range corresponding to longer wavelengths than the first spectral width wavelength range can be transmitted through the DBR structure to the lower and any further solar subcells disposed beneath the DBR structure.

In some embodiments, the successive DBR layer pairs are graded with a step-wise increasing lattice constant.

In some embodiments, the difference in refractive indices between the alternating layers in the DBR structure is maximized in order to minimize the number of periods required to achieve a given reflectivity, and the thickness and refractive index of each period of the DBR structure determines the stop band and its limiting wavelength, and wherein the DBR structure includes a first DBR sublayer composed of a plurality of n type or p type $In_wAl_yGa_{1-y-x}As$ layers, and a second DBR sublayer disposed over the first DBR sublayer and composed of a plurality of n type or p type $In_wAl_yGa_{1-y-w}As$ and $In_zAl_xGa_{1-z-x}As$ layers, where $0<w<1$, $0<x<1$, $0<y<1$, $0<z<1$.

In some embodiments, one or more of the subcells have a base region having a gradation in doping that increases exponentially from a value in the range of $1\times10^{15}$ to $1\times10^{18}$ free carriers per cubic centimeter adjacent the p-n junction to a value in the range of $1\times10^{16}$ to $4\times10^{18}$ free carriers per cubic centimeter adjacent to the adjoining layer at the rear of the base, and an emitter region having a gradation in doping that decreases from a value in the range of approximately $5\times10^{18}$ to $1\times10^{17}$ free carriers per cubic centimeter in the region immediately adjacent the adjoining layer to a value in the range of $5\times10^{15}$ to $1\times10^{18}$ free carriers per cubic centimeter in the region adjacent to the p-n junction.

In some embodiments, a layer of InGaAs, GaAsSb, InAsP, InAlAs, or SiGeSn, InGaAsN, InGaAsNSb, InGaAsNBi, InGaAsNSbBi, InGaSbN, InGaBiN or InGaSbBiN is deposited over the growth substrate.

In some embodiments, the growth substrate is composed of germanium.

In some embodiments, the second middle subcell includes a plurality of quantum well layers that are "strain balanced" by incorporating alternating lower band gap (or larger lattice constant) compressively strained InGaAs and higher band gap (or smaller lattice constant) tensionally strained GaAsP layers so that the larger/smaller atomic lattices/layers of epitaxy balance the strain to keep the quantum well layers lattice matched to the substrate.

In some embodiments, the number of quantum well layers is between 100 and 300.

In some embodiments, the quantum well layers form an intermediate band gap layer between the emitter layer and the base layer of the second middle subcell.

In some embodiments, the total thickness of the quantum well layers is between 200 nm and 2 um.

In some embodiments, the selection of the composition of the subcells and their band gaps maximizes the efficiency of the solar cell at a predetermined temperature value (between 28 and 70 degrees Centigrade) at a predetermined time after the initial deployment in space, (the time of the initial deployment being referred to as the "beginning-of-life (BOL)"), such predetermined time being referred to as the "end-of-life (EOL)" time, and such time being at least one year.

In some embodiments, the selection of the composition of the subcells and their band gaps maximizes the efficiency of the solar cell at a predetermined low intensity (less than 0.1 suns) and low temperature value (less than 100 degrees Centigrade) in deployment in space at a predetermined time after the initial deployment in space, or the "beginning-of-life (BOL)", such predetermined time being referred to as the "end-of-life (EOL)" time, and being at least one year.

In some embodiments of a four junction solar cell, the average band gap of all four subcells (i.e., the sum of the four band gaps of each subcell divided by four) is greater than 1.44 eV.

In some embodiments, the bottom subcell has a band gap of approximately 0.67 eV, the second middle subcell has a band gap of approximately 1.41 eV, the third middle subcell has a band gap in the range of approximately 1.6 to 1.8 eV and the upper first subcell has a band gap in the range of 2.0 to 2.20 eV.

In some embodiments, the third middle subcell has a band gap of approximately 1.73 eV and the upper subcell has a band gap of approximately 2.10 eV.

In some embodiments, the first solar subcell has a band gap of approximately 0.67 eV, the first middle subcell has a band gap in the range of 1.06 eV to 1.41 eV, the second middle subcell has a band gap in the range of 1.35 to 1.66 eV, but greater than the first middle subcell, the third middle subcell has a band gap in the range of 1.665 to 1.95 eV and the upper subcell has a band gap in the range of 1.95 to 2.20 eV.

In some embodiments, a four junction solar cell is provided such that:
the upper first solar subcell has a band gap of 2.10 eV; the second solar subcell has a bandgap of 1.73 eV; the third solar subcell has a band gap of 1.41 eV; and the fourth solar subcell has a band gap of 0.67 eV;
or
the upper first solar subcell has a band gap of 2.10 eV; the second solar subcell has a bandgap of 1.63 eV; the third solar subcell has a band gap of 1.335 or 1.311 or 1.3 or 1.289 eV; and the fourth solar subcell has a band gap of 0.67 eV;
or
the upper first solar subcell has a band gap of 2.10 eV; the second solar subcell has a bandgap of 1.57 eV; the third solar subcell has a band gap of 1.265 eV; and the fourth solar subcell has a band gap of 0.67 eV;
or
the upper first solar subcell has a band gap of 2.10 eV; the second solar subcell has a bandgap of 1.56 eV; the third solar subcell has a band gap of 1.25 eV; and the fourth solar subcell has a band gap of 0.67 eV;
or
the upper first solar subcell has a band gap of 2.10 eV; the second solar subcell has a bandgap of 1.73 eV; the third solar subcell has a band gap of 1.42 eV; and the fourth solar subcell has a band gap of 0.67 eV;
or
the upper first solar subcell has a band gap of 2.10 eV; the second solar subcell has a bandgap of 1.55 eV; the third solar subcell has a band gap of 1.197 eV; and the fourth solar subcell has a band gap of 0.67 eV;
or
the upper first solar subcell has a band gap of 2.10 eV; the second solar subcell has a bandgap of 1.53 eV; the third solar subcell has a band gap of 1.175 eV; and the fourth solar subcell has a band gap of 0.67 eV;
or
the upper first solar subcell has a band gap of 2.10 eV; the second solar subcell has a bandgap of 1.45 eV; the third solar subcell has a band gap of 1.1 eV; and the fourth solar subcell has a band gap of 0.67 eV.

Other combinations of band gaps may be suitable for some implementations.

In another aspect, the present disclosure provides a four junction solar cell comprising an upper first solar subcell composed of a semiconductor material having a first band gap; a second solar subcell adjacent to said first solar subcell and composed of a semiconductor material having a second band gap smaller than the first band gap and being lattice matched with the upper first solar subcell; a third solar subcell adjacent to said second solar subcell and composed of a semiconductor material having a third band gap smaller than the second band gap and being lattice matched with the second solar subcell; and a fourth solar subcell adjacent to and lattice mismatched to said third solar subcell and composed of a semiconductor material having a fourth band gap smaller than the third band gap; wherein the average band gap of all four subcells (i.e., the sum of the four band gaps of each subcell divided by four) is greater than 1.44 eV.

In another aspect, the present disclosure provides a four junction solar cell comprising an upper first solar subcell composed of a semiconductor material having a first band gap; a second solar subcell adjacent to said first solar subcell and composed of a semiconductor material having a second band gap smaller than the first band gap and being lattice matched with the upper first solar subcell; a third solar subcell adjacent to said second solar subcell and composed of a semiconductor material having a third band gap smaller than the second band gap and being lattice matched with the second solar subcell; a graded interlayer adjacent to said third solar subcell, said graded interlayer having a fourth band gap greater than said third band gap; and a fourth solar subcell adjacent to said third solar subcell and composed of a semiconductor material having a fifth band gap smaller than the fourth band gap and being lattice mismatched with the third solar subcell; wherein the graded interlayer is compositionally graded to lattice match the third solar subcell on one side and the lower fourth solar subcell on the other side, and is composed of any of the As, P, N, Sb based III-V compound semiconductors subject to the constraints of having the in-plane lattice parameter less than or equal to that of the third solar subcell and greater than or equal to that of the lower fourth solar subcell; wherein the fourth subcell has a direct band gap of greater than 0.75 eV.

In another aspect, the present disclosure provides a method of manufacturing a four junction solar cell comprising providing a germanium substrate; growing on the germanium substrate a sequence of layers of semiconductor material using a semiconductor disposition process to form a solar cell comprising a plurality of subcells including a metamorphic layer, third subcell disposed over the metamorphic layer and having a band gap of approximately 1.41 eV, a second subcell disposed over the third subcell and having a band gap in the range of approximately 1.6 to 1.8 eV and an upper first subcell disposed over the second subcell and having a band gap in the range of 2.0 to 2.20 eV.

In some embodiments, there further comprises forming (i) back surface field (BSF) layer disposed directly adjacent to the bottom surface of the third subcell, and (ii) at least one distributed Bragg reflector (DBR) layer directly below the BSF layer so that light can enter and pass through the first, second and third subcells and at least a portion of which be reflected back into the third subcell by the DBR layer.

In some embodiments, additional layer(s) may be added or deleted in the cell structure without departing from the scope of the present disclosure.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

The disclosure will be better and more fully appreciated by reference to the following detailed description when considered in conjunction with the accompanying drawings, wherein.

GLOSSARY OF TERMS

Figure 1:
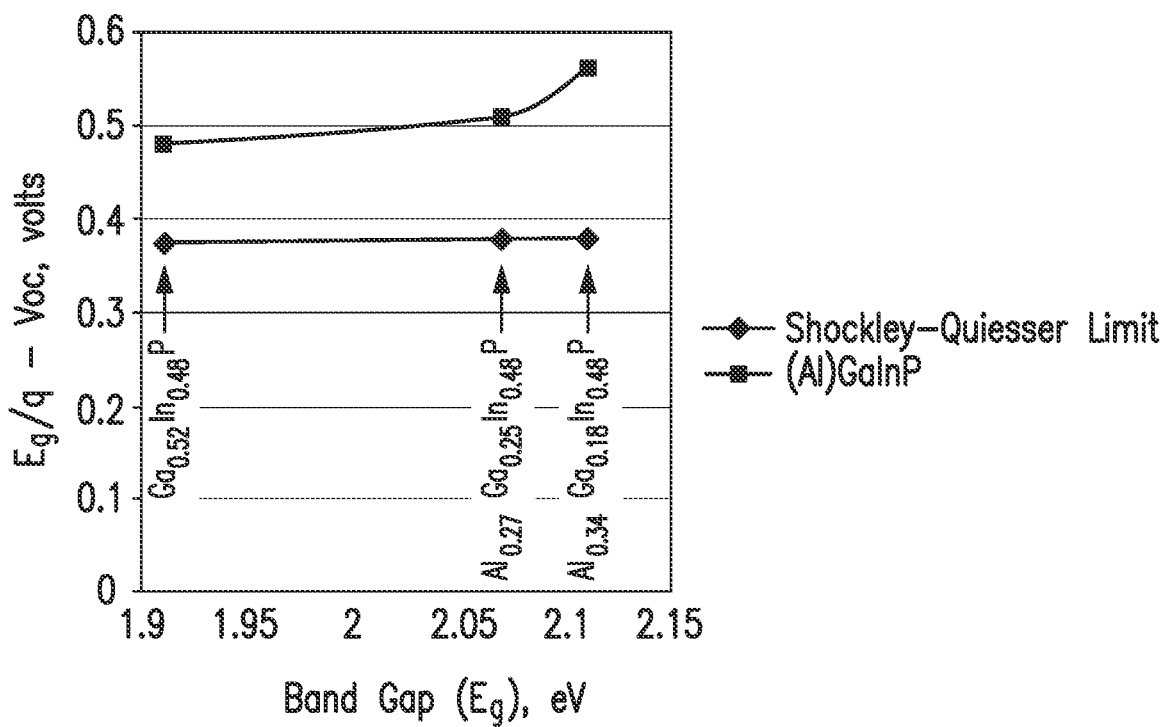
FIG. 1 is a graph representing the value of the BOL parameter $E_g/q - V_{oc}$ at 28° C. plotted against the band gap of certain binary materials defined along the x-axis.

"III-V compound semiconductor" refers to a compound semiconductor formed using at least one elements from group III of the periodic table and at least one element from group V of the periodic table. III-V compound semiconductors include binary, tertiary and quaternary compounds. Group III includes boron (B), aluminum (Al), gallium (Ga), indium (In) and thallium (T). Group V includes nitrogen (N), phosphorus (P), arsenic (As), antimony (Sb) and bismuth (Bi).

"Band gap" refers to an energy difference (e.g., in electron volts (eV)) separating the top of the valence band and the bottom of the conduction band of a semiconductor material.

"Beginning of Life (BOL)" refers to the time at which a photovoltaic power system is initially deployed in operation.

"Bottom subcell" refers to the subcell in a multijunction solar cell which is furthest from the primary light source for the solar cell.

"Compound semiconductor" refers to a semiconductor formed using two or more chemical elements.

"Current density" refers to the short circuit current density $J_{sc}$ through a solar subcell through a given planar area, or volume, of semiconductor material constituting the solar subcell.

"Deposited", with respect to a layer of semiconductor material, refers to a layer of material which is epitaxially grown over another semiconductor layer.

"End of Life (EOL)" refers to a predetermined time or times after the Beginning of Life, during which the photovoltaic power system has been deployed and has been operational. The EOL time or times may, for example, be specified by the customer as part of the required technical performance specifications of the photovoltaic power system to allow the solar cell designer to define the solar cell subcells and sublayer compositions of the solar cell to meet the technical performance requirement at the specified time or times, in addition to other design objectives. The terminology "EOL" is not meant to suggest that the photovoltaic power system is not operational or does not produce power after the EOL time.

"Graded interlayer" (or "grading interlayer")— see "metamorphic layer".

"Inverted metamorphic multijunction solar cell" or "IMM solar cell" refers to a solar cell in which the subcells are deposited or grown on a substrate in a "reverse" sequence such that the higher band gap subcells, which are to be the "top" subcells facing the solar radiation in the final deployment configuration, are deposited or grown on a growth substrate prior to depositing or growing the lower band gap subcells, following which the growth substrate is removed leaving the epitaxial structure.

"Layer" refers to a relatively planar sheet or thickness of semiconductor or other material. The layer may be deposited or grown, e.g., by epitaxial or other techniques.

"Lattice mismatched" refers to two adjacently disposed materials or layers (with thicknesses of greater than 100 nm) having in-plane lattice constants of the materials in their fully relaxed state differing from one another by more than 0.01% in lattice constant. (Applicant expressly adopts this definition for the purpose of this disclosure, and notes that this definition is considerably more stringent than that proposed, for example, in U.S. Pat. No. 8,962,993, which suggests more than 0.6% lattice constant difference).

"Metamorphic layer" or "graded interlayer" refers to a layer that achieves a gradual transition in lattice constant generally throughout its thickness in a semiconductor structure.

"Middle subcell" refers to a subcell in a multijunction solar cell which is neither a Top Subcell (as defined herein) nor a Bottom Subcell (as defined herein).

"Short circuit current ($I_{sc}$)" refers to the amount of electrical current through a solar cell or solar subcell when the voltage across the solar cell is zero volts, as represented and measured, for example, in units of milliamps.

"Short circuit current density"—see "current density".

"Solar cell" refers to an electro-optical semiconductor device operable to convert the energy of light directly into electricity by the photovoltaic effect.

"Solar cell assembly" refers to two or more solar cell subassemblies interconnected electrically with one another.

"Solar cell subassembly" refers to a stacked sequence of layers including one or more solar subcells.

"Solar subcell" refers to a stacked sequence of layers including a p-n photoactive junction composed of semiconductor materials. A solar subcell is designed to convert photons over different spectral or wavelength bands to electrical current.

"Substantially current matched" refers to the short circuit current through adjacent solar subcells being substantially identical (i.e. within plus or minus 1%).

"Top subcell" or "upper subcell" refers to the subcell in a multijunction solar cell which is closest to the primary light source for the solar cell.

"ZTJ" refers to the product designation of a commercially available SolAero Technologies Corp. triple junction solar cell.

DETAILED DESCRIPTION OF THE PREFERRED EMBODIMENTS

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

A variety of different features of multijunction solar cells (as well as inverted metamorphic multijunction solar cells) are disclosed in the related applications noted above. Some, many or all of such features may be included in the structures and processes associated with the non-inverted or "upright" solar cells of the present disclosure. However, more particularly, the present disclosure is directed to the fabrication of a multijunction lattice mismatched solar cell grown over a metamorphic layer grown on a single growth substrate. More specifically, however, in some embodiments, the present disclosure relates to four or five junction solar cells with direct band gaps in the range of 2.0 to 2.15 eV (or higher) for the top subcell, and (i) 1.6 to 1.8 eV, and (ii) 1.41 eV for the middle subcells, and 0.6 to 0.8 eV indirect band gaps, for the bottom subcell, respectively.

The conventional wisdom for many years has been that in a monolithic multijunction tandem solar cell, " . . . the desired optical transparency and current conductivity between the top and bottom cells . . . would be best achieved by lattice matching the top cell material to the bottom cell material. Mismatches in the lattice constants create defects or dislocations in the crystal lattice where recombination centers can occur to cause the loss of photogenerated minority carriers, thus significantly degrading the photovoltaic quality of the device. More specifically, such effects will decrease the open circuit voltage ($V_{oc}$), short circuit current ($J_{sc}$), and fill factor (FF), which represents the relationship or balance between current and voltage for effective output" (Jerry M. Olson, U.S. Pat. No. 4,667,059, "Current and Lattice Matched Tandem Solar Cell").

As progress has been made toward higher efficiency multijunction solar cells with four or more subcells, nevertheless, "it is conventionally assumed that substantially lattice-matched designs are desirable because they have proven reliability and because they use less semiconductor material than metamorphic solar cells, which require relatively thick buffer layers to accommodate differences in the lattice constants of the various materials" (Rebecca Elizabeth Jones-Albertus et al., U.S. Pat. No. 8,962,993).

Even more recently " . . . current output in each subcell must be the same for optimum efficiency in the series—connected configuration" (Richard R. King et al., U.S. Pat. No. 9,099,595).

The present disclosure provides an unconventional four junction design (with three grown lattice matched subcells, which are lattice mismatched to the Ge substrate) that leads to significant performance improvement in an AM0 spectral environment over that of a traditional three junction solar cell on Ge despite the lattice mismatch and substantial current mismatch between the top three subcells and the bottom Ge subcell. This performance gain is especially realized at high temperature and after high exposure to space radiation as a result of the proposal of the present disclosure to incorporate high band gap semiconductors that are inherently more resistant to radiation and temperature in spite of the disadvantages associated with lattice mismatch and current mismatch.

While the conventional wisdom suggests that the selection of the composition, band gaps, and thickness of each subcell is designed to ensure that the current is matched when operated in an AM0 spectral environment, the present design departs from that teaching and utilizes a design employing higher band gaps than the conventional design, and accordingly, a current mismatch between the upper subcells and the bottom subcell that is substantially greater than current commercial products or other proposed designs.

Although the advance of the present disclosure may be broadly characterized as the deliberate use of lattice mismatching and substantial current mismatching between subcells, in a four junction or five junction solar cell, another way of characterizing the present disclosure is that in some embodiments of a four junction solar cell, the average band gap of all four subcells (i.e., the sum of the four band gaps of each subcell divided by four) is greater than 1.44 eV.

In some embodiments, the growth substrate and fourth subcell is germanium, while in other embodiments the fourth subcell is InGaAs, GaAsSb, InAsP, InAlAs, or SiGeSn, InGaAsN, InGaAsNSb, InGaAsNBi, InGaAsNSbBi, InGaSbN, InGaBiN. InGaSbBiN or other III-V or II-VI compound semiconductor material.

Another descriptive aspect of the present disclosure is to characterize the fourth subcell as having a direct band gap of greater than 0.75 eV. The indirect band gap of germanium at room temperature is about 0.66 eV, while the direct band gap of germanium at room temperature is 0.8 eV. Those skilled in the art will normally refer to the "band gap" of germanium as 0.66 eV, since it is lower than the direct band gap value of 0.8 eV.

The recitation that "the fourth subcell has a direct band gap of greater than 0.75 eV" is therefore expressly meant to include germanium as a possible semiconductor for the fourth subcell, although other semiconductor material can be used as well.

More specifically, the present disclosure provides a multijunction solar cell in which the selection of the composition of the subcells and their band gaps maximizes the efficiency of the solar cell at a predetermined high temperature (in the range of 40 to 70 degrees Centigrade) in deployment in space at AM0 at a predetermined time after the initial deployment, such time being at least (i) one year, (ii) five years; (iii) ten years; or (iv) fifteen years.

The disclosure provides a relatively simple and reproducible technique that does not employ inverted processing associated with inverted metamorphic multijunction solar cells, and is suitable for use in a high volume production environment in which various semiconductor layers are grown on a growth substrate in an MOCVD reactor, and subsequent processing steps are defined and selected to minimize any physical damage to the quality of the deposited layers, thereby ensuring a relatively high yield of operable solar cells meeting specifications at the conclusion of the fabrication processes.

The lattice constants and electrical properties of the layers in the semiconductor structure are preferably controlled by specification of appropriate reactor growth temperatures and times, and by use of appropriate chemical composition and dopants. The use of a deposition method, such as Molecular Beam Epitaxy (MBE), Organo Metallic Vapor Phase Epitaxy (OMVPE), Metal Organic Chemical Vapor Deposition (MOCVD), or other vapor deposition methods for the growth may enable the layers in the monolithic semiconductor structure forming the cell to be grown with the required thickness, elemental composition, dopant concentration and grading and conductivity type.

The present disclosure is directed to, in one embodiment, a growth process using a metal organic chemical vapor deposition (MOCVD) process in a standard, commercially available reactor suitable for high volume production. More particularly, the present disclosure is directed to the materials and fabrication steps that are particularly suitable for producing commercially viable multijunction solar cells or inverted metamorphic multijunction solar cells using commercially available equipment and established high-volume fabrication processes, as contrasted with merely academic expositions of laboratory or experimental results.

Prior to discussing the specific embodiments of the solar cell of the present disclosure, a brief discussion of some of the issues associated with the design of multijunction solar cells, and in particular metamorphic solar cells, and the context of the composition or deposition of various specific layers in embodiments of the product as specified and defined by Applicant is in order.

There are a multitude of properties that should be considered in specifying and selecting the composition of, inter alia, a specific semiconductor layer, the back metal layer, the adhesive or bonding material, or the composition of the supporting material for mounting a solar cell thereon. For example, some of the properties that should be considered when selecting a particular layer or material are electrical properties (e.g. conductivity), optical properties (e.g., band gap, absorbance and reflectance), structural properties (e.g., thickness, strength, flexibility, Young's modulus, etc.), chemical properties (e.g., growth rates, the "sticking coefficient" or ability of one layer to adhere to another, stability of dopants and constituent materials with respect to adjacent layers and subsequent processes, etc.), thermal properties (e.g., thermal stability under temperature changes, coefficient of thermal expansion), and manufacturability (e.g., availability of materials, process complexity, process variability and tolerances, reproducibility of results over high volume, reliability and quality control issues).

In view of the trade-offs among these properties, it is not always evident that the selection of a material based on one of its characteristic properties is always or typically "the best" or "optimum" from a commercial standpoint or for Applicant's purposes. For example, theoretical studies may suggest the use of a quaternary material with a certain band gap for a particular subcell would be the optimum choice for that subcell layer based on fundamental semiconductor physics. As an example, the teachings of academic papers and related proposals for the design of very high efficiency (over 40%) solar cells may therefore suggest that a solar cell designer specify the use of a quaternary material (e.g., InGaAsP) for the active layer of a subcell. A few such devices may actually be fabricated by other researchers, efficiency measurements made, and the results published as an example of the ability of such researchers to advance the progress of science by increasing the demonstrated efficiency of a compound semiconductor multijunction solar cell. Although such experiments and publications are of "academic" interest, from the practical perspective of the Applicants in designing a compound semiconductor multijunction solar cell to be produced in high volume at reasonable cost and subject to manufacturing tolerances and variability inherent in the production processes, such an "optimum" design from an academic perspective is not necessarily the most desirable design in practice, and the teachings of such studies more likely than not point in the wrong direction and lead away from the proper design direction. Stated another way, such references may actually "teach away" from Applicant's research efforts and the ultimate solar cell design proposed by the Applicants.

Improvement in absorption efficiency is well known to be achieved by a tandem multijunction solar cell in which each subcell absorbs only a narrow energy band spectrum (or range of wavelengths). By connecting an optical series of subcells, each one with continuously decreasing energy gaps, the entire illumination energy will be converted into electricity. Since the subcells are also connected in an electrical series, current flows through each of the subcells, with the voltage associated with each subcell is determined by the material physical characteristics of each subcell.

In view of the foregoing, it is further evident that the identification or proportion of one particular constituent element (e.g. indium, or aluminum) in a particular subcell, or the thickness, band gap, doping, or other characteristic of the incorporation of that material in a particular subcell, is not a single, independent "result effective variable" that one skilled in the art can simply specify and incrementally adjust to a particular level and thereby increase the efficiency of a solar cell and its power output. The efficiency of a solar cell is not a simple linear algebraic equation as a function of the amount of gallium or aluminum or other element or material variable in a particular layer. The electrical characteristics of a semiconductor layer, such as the short circuit current ($J_{sc}$), the open circuit voltage ($V_{oc}$), and the fill factor (FF), are affected by several factors as the number of subcells, the thickness of each subcell, the composition and doping of each active layer in a subcell. The consequential band structure, electron energy levels, conduction, and absorption of photons of different wavelengths and diffusion lengths in each subcell are not easily mathematically computable as a function of any one, two or small number of distinct single material variables. As an example, the power output may be stipulated to be a product of voltage and current in a subcell, but a simpleminded "result effective variable" approach to change a material variable (such as the amount of an element or doping in the layer), to thereby increase the voltage in a subcell in anticipation that it may result in greater power output, may in fact lead to a decrease in current, or a current mismatch between adjacent subcells in a tandem solar cell, or other interdependent effects (e.g., increased dopants diffusing into other layers and thereby adversely affecting them), with the overall effect of decreasing the power output of the solar cell.

The growth of each of the epitaxial layers of a solar cell in an MOCVD reactor is a non-equilibrium thermodynamic process with dynamically changing spatial and temporal boundary conditions that is not readily or predictably modeled. The formulation and solution of the relevant simultaneous partial differential equations covering such processes are not within the ambit of those of ordinary skill in the art in the field of solar cell design.

Even when it is known that particular variables have an impact on electrical, optical, chemical, thermal or other characteristics, the nature of the impact often cannot be predicted with much accuracy, particularly when the variables interact in complex ways, leading to unexpected results and unintended consequences. Thus, significant trial and error, which may include the fabrication and evaluative testing of many prototype devices, often over a period of time of months if not years, is required to determine whether a proposed structure with layers of particular compositions, actually will operate as intended, let alone whether it can be fabricated in a reproducible high volume manner within the manufacturing tolerances and variability inherent in the production process, and necessary for the design of a commercially viable device.

An illustration of the types of challenges faced by a designer of a photovoltaic power system for a space mission, identifying some of the specific issues faced with respect to the operating environment of the solar cells, a brief excerpt from a paper presented at the 37th Photovoltaic Specialists Conference in 2011 is presented herein.

The unique space mission described in that paper is the NASA Solar Probe Plus ("SPP"), which is a spacecraft planned for launching in July 2018 to travel in the region of the Sun's corona and withstand temperatures of up to 1370 degrees Centigrade. As described by NASA, the 1350 pound spacecraft with a photovoltaic power system producing over 200 watts, will travel between the Earth and the Sun, specifically between the maximum aphelion at 1.02 AU (or 219 Rs, where "R" is the value of the sun's radius) and the minimum perihelion at 9.5 Rs (or 3.7 million miles), where the solar irradiance levels will vary between 0.97× and 513×. Nevertheless, the requirements for minimum power production and maximum waste heat dissipation from the array remain more or less constant throughout the orbit. Although the present disclosure is not directed to the Solar Probe Plus solar cells, the design issues are illustrative and worthy of note.

The paper observes that, "Array-design modeling for SPP is an iterative process, due to the large number of interdependent unknowns. For example, the cell power conversion efficiency depends on the operating temperature, which in turn depends on the efficiency. The material choices for the array depend on the array operating conditions (most notably, temperature and solar irradiance levels) which in turn depend on the properties of the constituent array materials. And the array geometry (i.e., length/width of the primary and secondary arrays, and the angle between them) necessary to meet the power production requirements of the mission depends on the irradiance, which in turn depends on the array geometry—and so on."

Furthermore, as in the case here, where multiple interdependent variables interact in unpredictable ways, the "discovery" of the proper choice of the combination of variables can produce new and unexpected results, and constitute an "inventive step".

The exemplary solar cell described herein may require the use of aluminum in the semiconductor composition of each of the top two subcells. For example, in some cases, an upper subcell may have an aluminum content in excess of 30% by mole fraction. Likewise, in some cases, a middle subcell may have an aluminum content in excess of 25% by mole fraction. Aluminum incorporation is widely known in the III-V compound semiconductor industry to degrade BOL subcell performance due to deep level donor defects, higher doping compensation, shorter minority carrier lifetimes, and lower cell voltage and an increased BOL $E_g/q-V_{oc}$ metric. In short, increased BOL $E_g/q-V_{oc}$ may be the most problematic shortcoming of aluminum containing subcells; the other limitations can be mitigated by modifying the doping schedule or thinning base thicknesses.

One aspect of the present disclosure relates to the use of substantial amounts of aluminum in the active layers of the upper subcells in a multijunction solar cell. The effects of increasing amounts of aluminum as a constituent element in an active layer of a subcell affects the photovoltaic device performance. One measure of the "quality" or "goodness" of a solar cell subcell or junction is the difference between the band gap of the semiconductor material in that subcell or junction and the $V_{oc}$, or open circuit voltage, of that same junction. The smaller the difference, the higher the $V_{oc}$ of the solar cell junction relative to the band gap, and the better the performance of the device. $V_{oc}$ is very sensitive to semiconductor material quality, so the smaller the $E_g/q-V_{oc}$ of a device, the higher the quality of the material in that device. There is a theoretical limit to this difference, known as the Shockley-Queisser limit. That is the best that a solar cell junction can be under a given concentration of light at a given temperature.

The experimental data obtained for single junction (Al)GaInP solar cells indicates that increasing the Al content of the junction leads to a larger $V_{oc}-E_g/q$ difference, indicating that the material quality of the junction decreases with increasing Al content. FIG. 1 shows this effect. The three compositions cited in the Figure are all lattice matched to GaAs, but have differing Al composition. As seen by the different compositions represented, with increasing amount of aluminum represented by the x-axis, adding more Al to the semiconductor composition increases the band gap of the junction, but in so doing also increases $V_{oc}-E_g/q$. Hence, we draw the conclusion that adding Al to a semiconductor material degrades that material such that a solar cell device made out of that material does not perform relatively as well as a junction with less Al.

Figure 2:
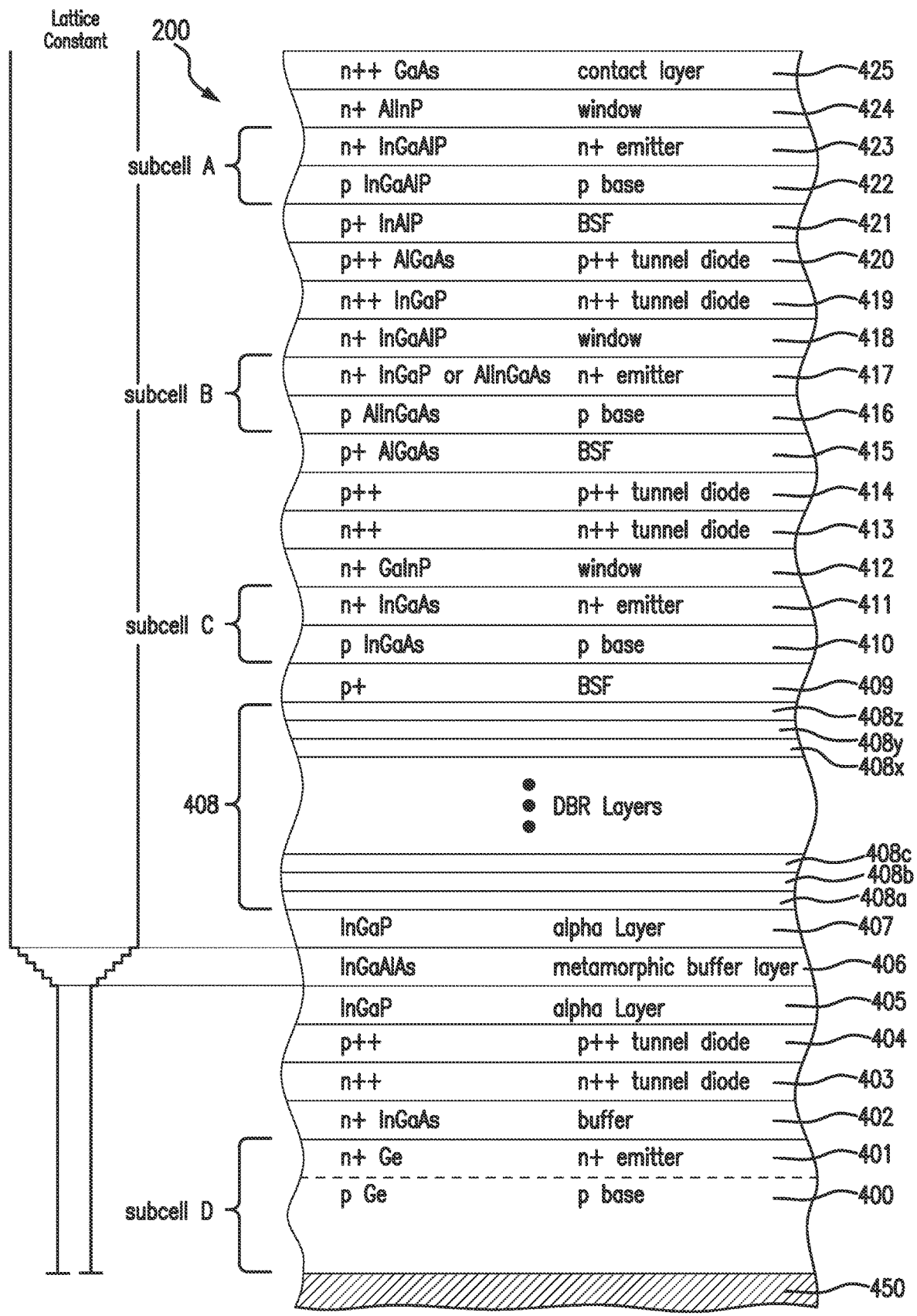
FIG. 2 is a cross-sectional view of a first embodiment of a four junction solar cell after several stages of fabrication including the growth of certain semiconductor layers on the growth substrate up to the contact layer, according to the present disclosure.

Turning to the multijunction solar cell device of the present disclosure, FIG. 2 is a cross-sectional view of an embodiment of a four junction solar cell 200 after several stages of fabrication including the growth of certain semiconductor layers on the growth substrate up to the contact layer 425.

As shown in the illustrated example of FIG. 2, the growth substrate or bottom subcell D includes a substrate 400 formed of p-type germanium ("Ge") which also serves as a base layer. A back metal contact pad 450 formed on the bottom of base layer 400 provides one electrical contact of a positive polarity to the multijunction solar cell 500. The bottom subcell D, further includes, for example, a highly doped n-type Ge emitter layer 401, and an n-type indium gallium arsenide ("InGaAs") nucleation layer 402. The nucleation layer is deposited over the base layer, and the emitter layer is formed in the substrate by diffusion of deposits into the Ge substrate, thereby forming the n-type Ge layer 401. Heavily doped p-type aluminum gallium arsenide ("AlGaAs") and heavily doped n-type gallium arsenide ("GaAs") tunneling junction layers 403, 404 may be deposited over the nucleation layer to provide a low resistance pathway between the bottom and middle subcells.

A first alpha layer 405, preferably composed of n-type InGaP or other suitable material, is deposited over the tunnel diode 403/404, to a thickness of between 0.25 and 1.0 micron. Such an alpha layer is intended to prevent threading dislocations from propagating, either opposite to the direction of growth into the bottom subcell D, or in the direction of growth into the subcell C, and is more particularly described in U.S. Patent Application Pub. No. 2009/0078309 A1 (Cornfeld et al.).

A metamorphic layer (or graded interlayer) 406 is deposited over the alpha layer 405 using a surfactant. Layer 406 is preferably a compositionally step-graded series of InGaAlAs layers, preferably with monotonically changing lattice constant, so as to achieve a gradual transition in lattice constant in the semiconductor structure from subcell D to subcell C while minimizing threading dislocations from occurring. The band gap of layer 406 is constant throughout its thickness, in the range of 1.22 to 1.54 eV, or otherwise consistent with a value slightly greater than the band gap of the middle subcell C. One embodiment of the graded interlayer may also be expressed as being composed of $In_xGa_{1-x}As$, $0<x<1$, $0<y<1$, with x and y selected such that the band gap of the interlayer remains constant at approximately 1.22 to 1.54 eV or other appropriate band gap.

In the surfactant assisted growth of the metamorphic layer 406, a suitable chemical element is introduced into the reactor during the growth of layer 406 to improve the surface characteristics of the layer. In one embodiment, such element may be a dopant or donor atom such as selenium (Se) or tellurium (Te). Small amounts of Se or Te are therefore incorporated in the metamorphic layer 406, and remain in the finished solar cell. Although Se or Te are the preferred n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic one may use an isoelectronic surfactant. The term "isoelectronic" refers to surfactants such as antimony (Sb) or bismuth (Bi), since such elements have the same number of valence electrons as the P atom of InGaP, or the As atom in InGaAlAs, in the metamorphic buffer layer. Such Sb or Bi surfactants will not typically be incorporated into the metamorphic layer 406.

In one embodiment of the present disclosure, the layer 406 is composed of a plurality of layers of InGaAs, with monotonically changing lattice constant, each layer having the same band gap, approximately in the range of 1.22 to 1.54 eV. In some embodiments, the constant band gap is in the range of 1.27 to 1.31 eV. In some embodiments, the constant band gap is in the range of 1.28 to 1.29 eV.

The advantage of utilizing a constant bandgap material such as InGaAs is that arsenide-based semiconductor material is much easier to process in standard commercial MOCVD reactors.

Although one embodiment of the present disclosure utilizes a plurality of layers of InGaAs for the metamorphic layer 406 for reasons of manufacturability and radiation transparency, other embodiments of the present disclosure may utilize different material systems to achieve a change in lattice constant from subcell C to subcell D. Other embodiments of the present disclosure may utilize continuously graded, as opposed to step graded, materials. More generally, the graded interlayer may be composed of any of the As, P, N, Sb based III-V compound semiconductors subject to the constraints of having the in-plane lattice parameter greater than or equal to that of the bottom solar cell and less than or equal to that of the third solar cell, and having a bandgap energy greater than that of the third solar cell.

A second alpha layer 407, preferably composed of n+ type InGaP with a different composition than the first alpha layer 405, is deposited over metamorphic buffer layer 406, to a thickness from 0.25 to 1.0 micron. Such an alpha layer is intended to prevent threading dislocations from propagating, either opposite to the direction of growth into the subcell D, or in the direction of growth into the subcell C, and is more particularly described in U.S. Patent Application Pub. No. 2009/0078309 A1 (Cornfeld et al.).

Figure 3:
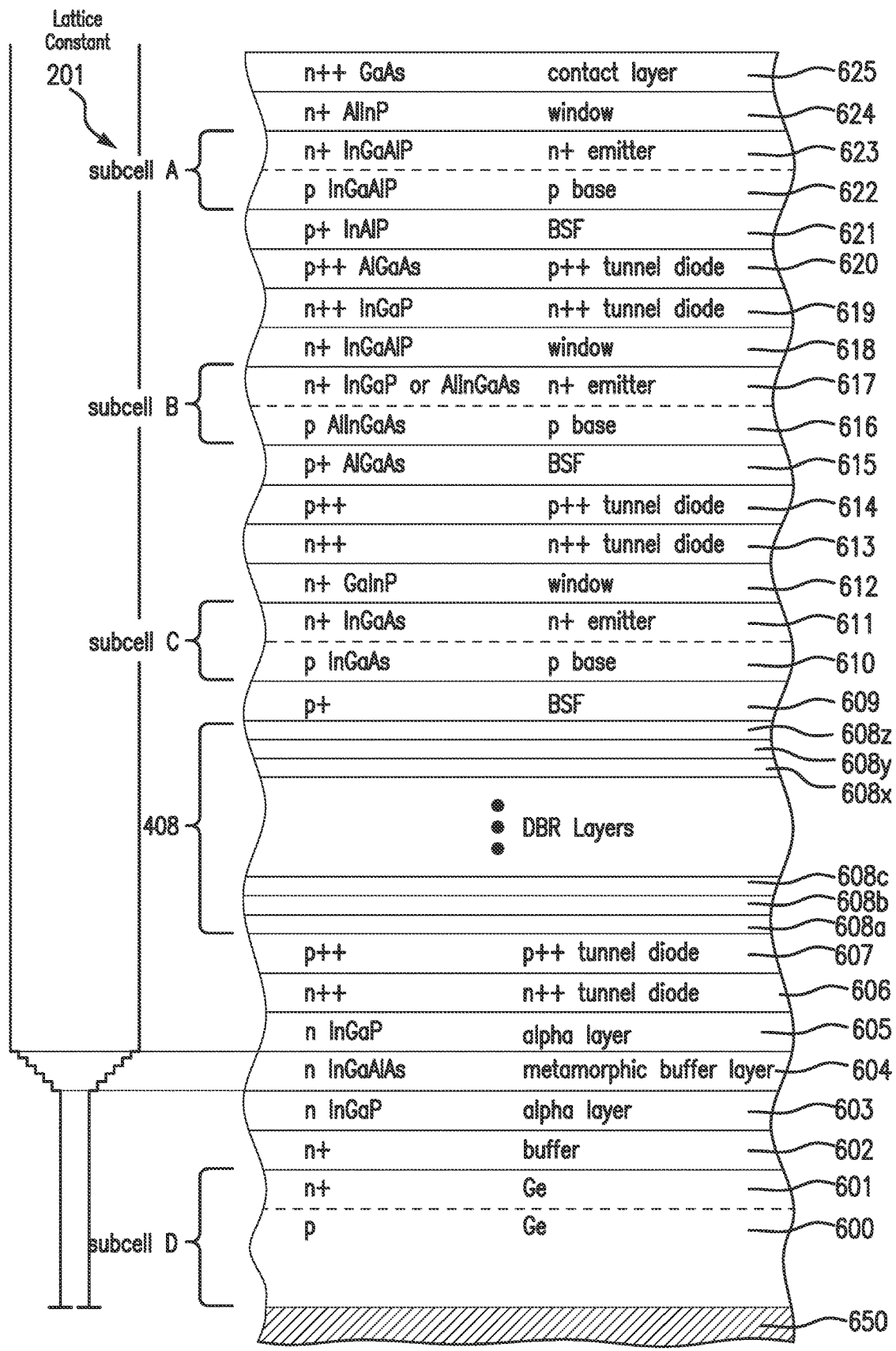
FIG. 3 is a cross-sectional view of a second embodiment of a four junction solar cell after several stages of fabrication including the growth of certain semiconductor layers on the growth substrate up to the contact layer, according to the present disclosure.

Distributed Bragg reflector (DBR) layers 408 are then grown adjacent to and between the second alpha layer 407 and the third solar subcell C. The DBR layers 408 are arranged so that light can enter and pass through the third solar subcell C and at least a portion of which can be reflected back into the third solar subcell C by the DBR layers 408. In the embodiment depicted in FIG. 2, the distributed Bragg reflector (DBR) layers 408 are specifically located between the third solar subcell C and alpha layers 407; in other embodiments, the distributed Bragg reflector (DBR) layers may be located above the tunnel diode layers, as depicted in FIG. 3.

For some embodiments, distributed Bragg reflector (DBR) layers 408 can be composed of a plurality of alternating layers 408a through 408z of lattice matched materials with discontinuities in their respective indices of refraction. For certain embodiments, the difference in refractive indices between alternating layers is maximized in order to minimize the number of periods required to achieve a given reflectivity, and the thickness and refractive index of each period determines the stop band and its limiting wavelength.

For some embodiments, distributed Bragg reflector (DBR) layers 408a through 408z includes a first DBR layer composed of a plurality of n type or p type $Al_xGa_{1-x}As$ layers, and a second DBR layer disposed over the first DBR layer and composed of a plurality of n type or p type $Al_yGa_{1-y}As$ layers, where $0<x<1$, $0<y<1$, and y is greater than x.

In the illustrated example of FIG. 2, the subcell C includes a highly doped p-type aluminum gallium arsenide ("AlGaAs") back surface field ("BSF") layer 409, a p-type InGaAs base layer 410, a highly doped n-type indium gallium phosphide ("InGaP2") emitter layer 411 and a highly doped n-type indium aluminum phosphide ("AlInP2") window layer 412. The InGaAs base layer 410 of the subcell C can include, for example, approximately 1.5% In. Other compositions may be used as well. The base layer 410 is formed over the BSF layer 409 after the BSF layer is deposited over the DBR layers 408a through 408z.

The window layer 412 is deposited on the emitter layer 411 of the subcell C. The window layer 412 in the subcell C also helps reduce the recombination loss and improves passivation of the cell surface of the underlying junctions. Before depositing the layers of the subcell B, heavily doped n-type InGaP and p-type AlGaAs (or other suitable compositions) tunneling junction layers 413, 414 may be deposited over the subcell C.

The middle subcell B includes a highly doped p-type aluminum gallium arsenide ("AlGaAs") back surface field ("BSF") layer 415, a p-type AlGaAs base layer 416, a highly doped n-type indium gallium phosphide ("InGaP2") or AlGaAs layer 417 and a highly doped n-type indium gallium aluminum phosphide ("AlGaAlP") window layer 418. The InGaP emitter layer 417 of the subcell B can include, for example, approximately 50% In. Other compositions may be used as well.

Before depositing the layers of the top cell A, heavily doped n-type InGaP and p-type AlGaAs tunneling junction layers 419, 420 may be deposited over the subcell B.

In the illustrated example, the top subcell A includes a highly doped p-type indium aluminum phosphide ("InAlP") BSF layer 421, a p-type InGaAlP base layer 422, a highly doped n-type InGaAlP emitter layer 423 and a highly doped n-type InAlP2 window layer 424. The base layer 422 of the top subcell A is deposited over the BSF layer 421 after the BSF layer 421 is formed over the tunneling junction layers 419, 420 of the subcell B. The window layer 424 is deposited over the emitter layer 423 of the top subcell A after the emitter layer 423 is formed over the base layer 422.

A cap or contact layer 425 may be deposited and patterned into separate contact regions over the window layer 424 of the top subcell A. The cap or contact layer 425 serves as an electrical contact from the top subcell A to metal grid layer (not shown). The doped cap or contact layer 425 can be a semiconductor layer such as, for example, a GaAs or InGaAs layer.

After the cap or contact layer 425 is deposited, the grid lines are formed via evaporation and lithographically patterned and deposited over the cap or contact layer 425.

FIG. 3 is a cross-sectional view of a second embodiment of a four junction solar cell 201 after several stages of fabrication including the growth of certain semiconductor layers on the growth substrate up to the contact layer, according to the present disclosure.

The second embodiment depicted in FIG. 3 is similar to that of the first embodiment depicted in FIG. 2 except that the metamorphic buffer layer 406 is disposed before the tunnel diode layers 403, 404 are deposited.

In FIG. 3, layers 650, 601, and 602 are substantially identical to that of layers 450, 401, and 402 in FIG. 2, and layers 608a, 608b, ... 625 are substantially identical to that of layers 408a, 408b, ... 425 in FIG. 2, so such description will not be repeated here for brevity.

Similarly, the first alpha layer 603, the metamorphic buffer layer 604, and second alpha layer 605 are similar to that of layers 405, 406 and 407 of FIG. 2, and the tunnel diode layer 606, 607 are similar to that of layer 403, 404 of FIG. 2.

Figure 4:
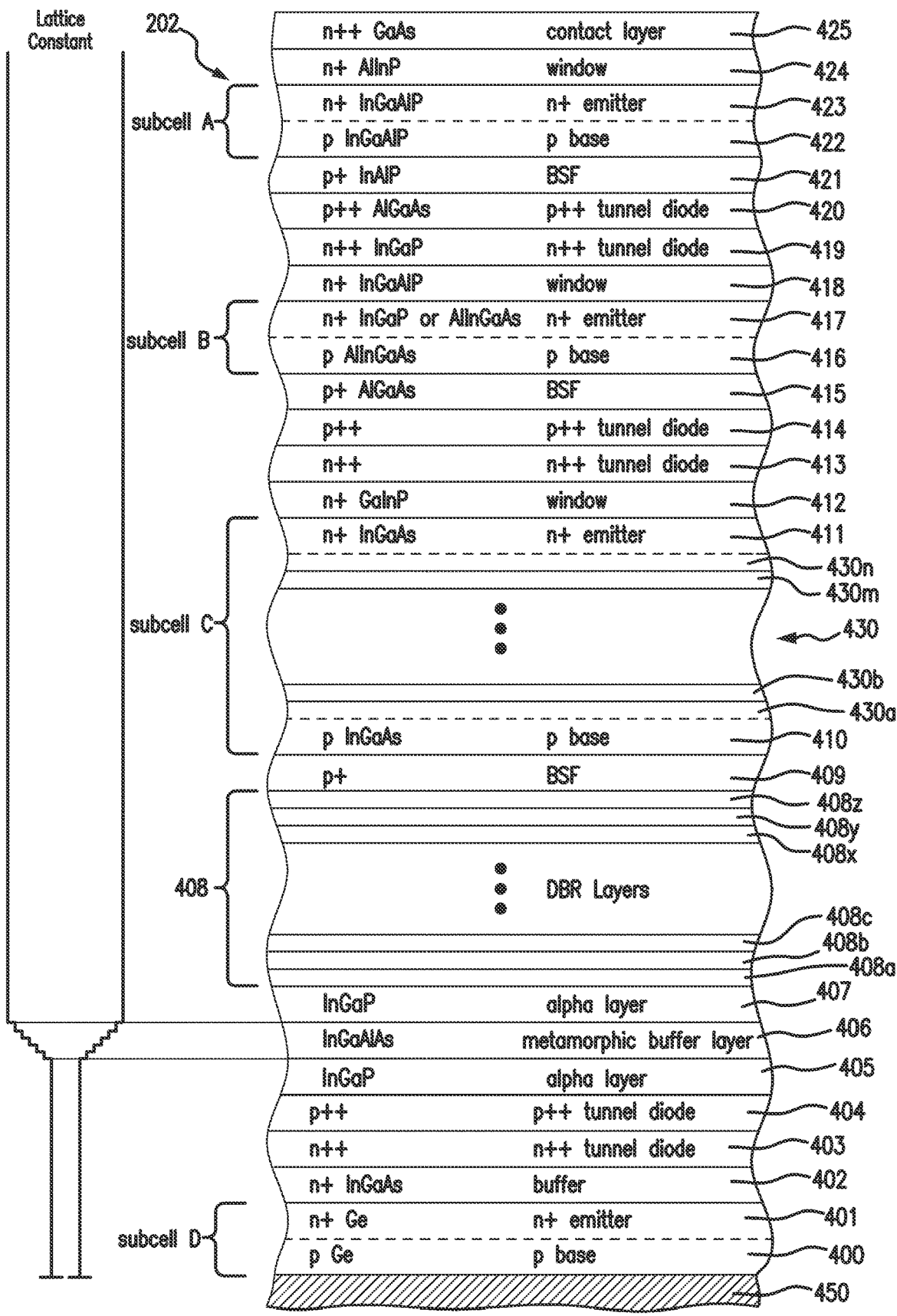
FIG. 4 is a cross-sectional view of a third embodiment of a four junction solar cell after several stages of fabrication including the growth of certain semiconductor layers on the growth substrate up to the contact layer, according to the present disclosure.

FIG. 4 is a cross-sectional view of a third embodiment of a four junction solar cell 202 after several steps of fabrication including the growth of certain semiconductor layers on the growth substrate up to the contact layer, according to the present disclosure.

The third embodiment depicted in FIG. 4 is similar to that of the first embodiment depicted in FIG. 2 except that a quantum well structure 500 is included in subcell C.

In FIG. 4, in one embodiment quantum well layers 501a through 501n are disposed between the base layer 410 and the emitter layer 411 of subcell C.

Quantum well structures in multijunction solar cells are known from U.S. patent application Ser. No. 11/788,315, filed Apr. 18, 2007 hereby incorporated by reference.

In some embodiments, the plurality of quantum layers are "strained balanced" by incorporating alternating lower band gap (or larger lattice constant) compressively strained InGaAs and higher band gap (or smaller lattice constant) tensionally strained GaAsP layers so that the larger/smaller atomic lattices/layers of epitaxy balance the strain to keep the quantum well layers lattice matched to the substrate.

In some embodiments, the number of quantum well layers are between 10 and 300, which each layer being between 10 and 1000 angstroms in thickness.

In some embodiments, the quantum well layers form an intermediate band gap layer between the emitter layer and the base layer of the second middle subcell.

In some embodiments, the total thickness of the quantum well layers is between two and four microns.

Figure 5:
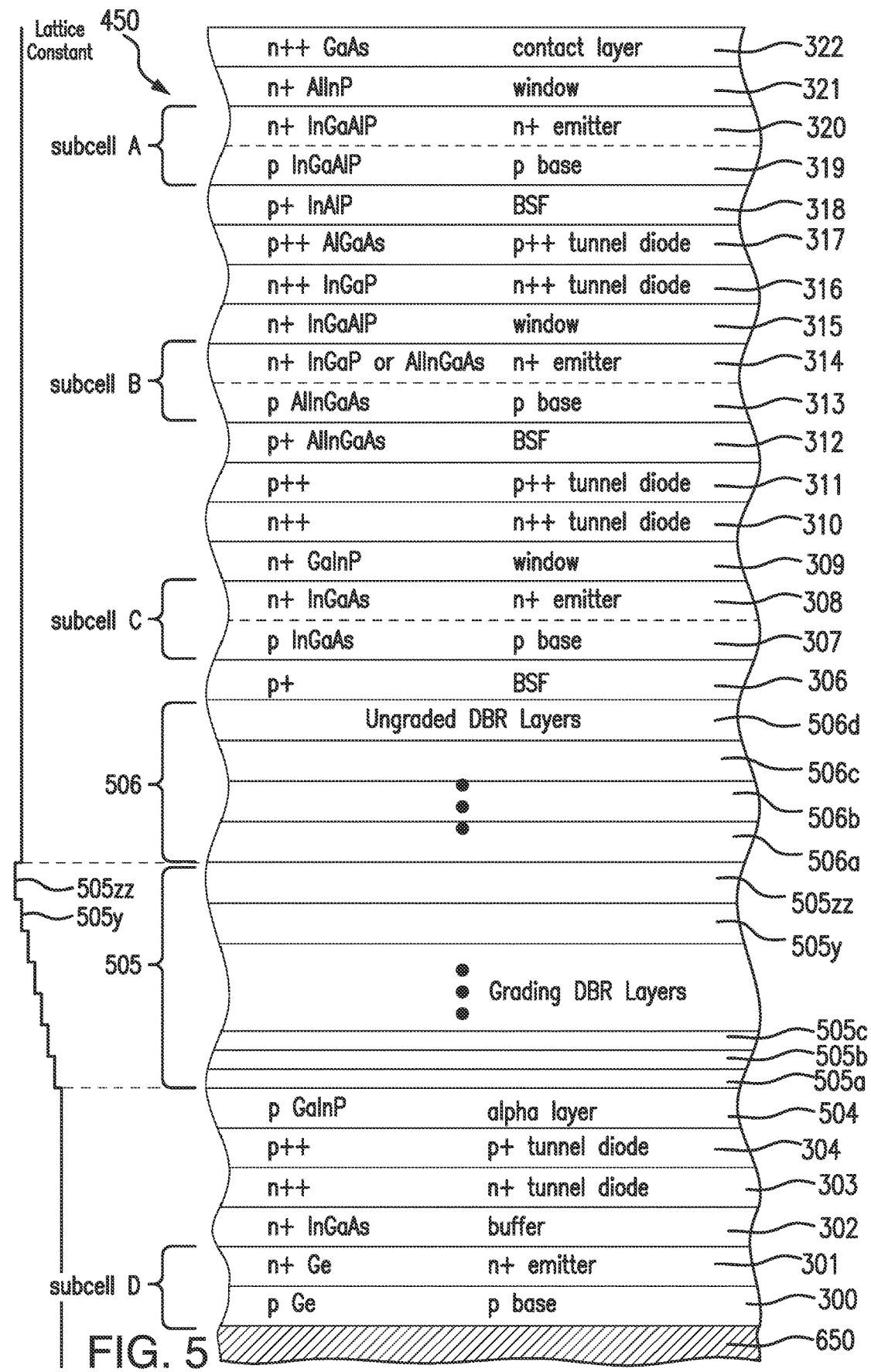
FIG. 5 is a graph of the doping profile in the fourth embodiment of a subcell in the solar cell according to the present disclosure.

FIG. 5 is a cross-sectional view of a fourth embodiment of a four junction solar cell 300 after several stages of fabrication including the growth of certain semiconductor layers on the growth substrate up to the contact layer, according to the present disclosure.

The fourth embodiment depicted in FIG. 5 is similar to that of the first embodiment depicted in FIG. 2 except that the metamorphic buffer layer 406 and the DBR layers 408 of FIG. 2.

In FIG. 5, layers 350, 300, 301, 302, 303 and 304 are substantially identical to that of layers 450, 401, 402, 403 and 404 in FIG. 2, and layers 306, 307, . . . 322 are substantially identical to that of layers 409, 410, 411, . . . 425 in FIG. 2, so such description will not be repeated here for brevity.

FIG. 5 depicts an intermediate layer 505, 506 directly adjacent to and disposed between the third (Subcell C) and the fourth (Subcell D) solar subcells and compositionally graded to lattice match the third solar subcell on one side and the fourth solar subcell on the other side, and arranged so that light can enter and pass through the third solar subcell and at least a portion of which can be reflected back into the third solar subcell by the intermediate layer. The intermediate layer 505, 506 is composed of a plurality of layers of materials with discontinuities in their respective indices of refraction.

In some embodiments, the intermediate layer 505, 506 includes a first portion 505 composed of a plurality DBR layer pairs with each successive pair having a gradation in lattice constant, and a second portion 506 disposed over the first portion composed of a plurality of DBR pairs with a constant lattice constant.

In some embodiments, the DBR layers in the first portion 505 are composed of n or p type $In_wAl_yGa_{1-y-w}As$ and $In_zAl_xGa_{1-z-x}As$ layer pairs with the amount of indium in each pair increasing by approximately 3% in each graded step, where $0<w<1$, $0<x<1$, $0<y<1$, $0<z<1$, with y greater than w and z.

In some embodiments, the total number of DBR layer pairs in the intermediate layer 505, 506 is between 10 and 20.

In the embodiment depicted in FIG. 5, the first portion 505 of an intermediate layer 505 and 506 comprises step-graded sublayers 505a through 505zz disposed over the tunnel diode layer 304. In particular, the graded interlayer 505 provides a transition in lattice constant from the lattice constant of the substrate to the larger lattice constant of the third and upper subcell C.

In one embodiment, the top or uppermost sublayer 505zz of the graded interlayer 505 is strained or only partially relaxed (unlike the fully relaxed layers below it) since it has a lattice constant which is greater than that of the layer above it, i.e., the layer 506a or the BSF layer 306 above the layers 506. In short, in this embodiment there is an "overshoot" of the grading layers, 505a through 505y as depicted on the left hand side of FIG. 5 which shows the step-grading of the lattice constant becoming larger from layer 505a to a 505zz.

Another feature of the present disclosure relates to the doping levels in the subcells of the solar cell. In some embodiments, at least the base of at least one of the first, second or third solar subcells has a graded doping, i.e., the level of doping varies from one surface to the other throughout the thickness of the base layer. In some embodiments, the gradation in doping is exponential. In some embodiments, the gradation in doping is incremental and monotonic.

In some embodiments, the emitter of at least one of the first, second or third solar subcells also has a graded doping, i.e., the level of doping varies from one surface to the other throughout the thickness of the emitter layer. In some embodiments, the gradation in doping is linear or monotonically decreasing.

Figure 6:
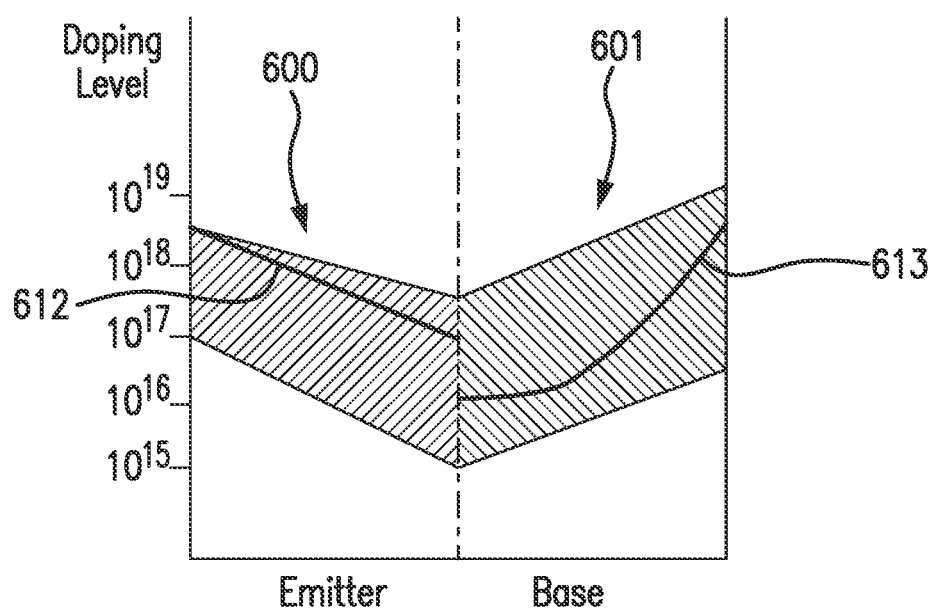
FIG. 6 is a graph of the doping profile in the base and emitter layers of a subcell in the solar cell according to the present disclosure.

As a specific example, the doping profile of the emitter and base layers may be illustrated in FIG. 6, which depicts ranges of the amount of doping in the emitter region and the base region of a subcell. N-type dopants include silicon, selenium, sulfur, germanium or tin. P-type dopants include silicon, zinc, chromium, or germanium.

In the example of FIG. 6, in some embodiments, one or more of the subcells have a base region having a gradation in doping that increases from a value in the range of $1\times10^{15}$ to $1\times10^{18}$ free carriers per cubic centimeter adjacent the p-n junction to a value in the range of $1\times10^{16}$ to $4\times10^{18}$ free carriers per cubic centimeter adjacent to the adjoining layer at the rear of the base, and an emitter region having a gradation in doping that decreases from a value in the range of approximately $5\times10^{18}$ to $1\times10^{17}$ free carriers per cubic centimeter in the region immediately adjacent the adjoining layer to a value in the range of $5\times10^{15}$ to $1\times10^{18}$ free carriers per cubic centimeter in the region adjacent to the p-n junction.

The heavy lines 602 and 603 shown in FIG. 6 illustrates one embodiment of the base doping having an exponential gradation, and the emitter doping being linear.

Thus, in one embodiment, the doping level throughout the thickness of the base layer may be exponentially graded from approximately $1\times10^{16}$ free carriers per cubic centimeter to $1\times10^{18}$ free carriers per cubic centimeter, as represented by the curve 603 depicted in the Figure.

Similarly, in one embodiment, the doping level throughout the thickness of the emitter layer may decline linearly from approximately $5\times10^{18}$ free carriers per cubic centimeter to $5\times10^{17}$ free carriers per cubic centimeter, as represented by the curve 602 depicted in the Figure.

The absolute value of the collection field generated by an exponential doping gradient $\exp[-x/\lambda]$ is given by the constant electric field of magnitude $E=kT/q(1/\lambda))(\exp[-x_b/\lambda])$, where k is the Boltzman constant, T is the absolute temperature in degrees Kelvin, q is the absolute value of electronic charge, and $\lambda$ is a parameter characteristic of the doping decay.

The efficacy of an embodiment of the doping arrangement of the present disclosure has been demonstrated in a test solar cell which incorporated an exponential doping profile in the three micron thick base layer in a subcell of one embodiment of the disclosure.

The exponential doping profile taught by one embodiment of the present disclosure produces a constant field in the doped region. In the particular multijunction solar cell materials and structure of the present disclosure, the bottom subcell has the smallest short circuit current among all the subcells. Since in a multijunction solar cell, the individual subcells are stacked and form a series electrical circuit, the total current flow in the entire solar cell is therefore limited by the smallest current produced in any of the subcells. Thus, by increasing the short circuit current in the bottom cell, the current more closely approximates that of the higher subcells, and the overall efficiency of the solar cell is increased as well. In a multijunction solar cell with approximately efficiency, the implementation of the present doping arrangement would thereby increase efficiency. In addition to an increase in efficiency, the collection field created by the exponential doping profile will enhance the radiation hardness of the solar cell, which is important for spacecraft applications.

Although the exponentially doped profile is the doping design which has been implemented and verified, other doping profiles may give rise to a linear varying collection field which may offer yet other advantages. For example, another doping profile may produce a linear field in the doped region which would be advantageous for both minority carrier collection and for radiation hardness at the end-of-life (EOL) of the solar cell. Such other doping profiles in one or more base layers are within the scope of the present disclosure.

The doping profile depicted herein are merely illustrative, and other more complex profiles may be utilized as would be apparent to those skilled in the art without departing from the scope of the present invention.

The present disclosure, like related U.S. patent application Ser. No. 14/828,206, provides a multijunction solar cell that follows a design rule that one should incorporate as many high band gap subcells as possible to achieve the goal to increase the efficiency at either room temperature (28° C.) or high temperature (i.e., 50° to 70° C.) EOL. For example, high band gap subcells may retain a greater percentage of cell voltage as temperature increases, thereby offering lower power loss as temperature increases. As a result, both HT-BOL and HT-EOL performance of the exemplary multijunction solar cell, according to the present disclosure, may be expected to be greater than traditional cells.

In view of different satellite and space vehicle requirements in terms of operating environmental temperature, radiation exposure, and operational life, a range of subcell designs using the design principles of the present disclosure may be provided satisfying specific defined customer and mission requirements, and several illustrative embodiments are set forth hereunder, along with the computation of their efficiency at the end-of-life for comparison purposes. As described in greater detail below, solar cell performance after radiation exposure is experimentally measured using 1 MeV electron fluence per square centimeter (abbreviated in the text that follows as $e/cm^2$), so that a comparison can be made between the current commercial devices and embodiments of solar cells discussed in the present disclosure.

As an example of different mission requirements, a low earth orbit (LEO) satellite will typically experience radiation equivalent to $5 \times 10^{14}$ electron fluence per square centimeter (hereinafter written as "5E14 $e/cm^2$") over a five year lifetime. A geosynchronous earth orbit (GEO) satellite will typically experience radiation in the range of $5 \times 10^{14}$ $e/cm^2$ to $1 \times 10^{15}$ $e/cm^2$ over a fifteen year lifetime.

As a baseline comparison, the cell efficiency (%) measured at room temperature (RT) 28° C. and high temperature (HT) 70° C., at beginning of life (BOL) and end of life (EOL), for a standard three junction commercial solar cell (the ZTJ solar cell of SolAero Technologies Corp., of Albuquerque, N. Mex.), is as follows:

| Condition | Efficiency | |
|---|---|---|
| BOL 28° C. | 29.1% | |
| BOL 70° C. | 26.4% | |
| EOL 70° C. | 23.4% | after 5E14 $e/cm^2$ radiation |
| EOL 70° C. | 22.0% | after 1E15 $e/cm^2$ radiation |

$J_{SC}$ at EOL 70° after 1E15 $e/cm^2$ radiation: 17.2 mA
Ratio $J_{1-2}/J_3$: 139%

The $J_{sc}$ of the upper two subcells at EOL under 1E15 $e/cm^2$ conditions is 17.2 mA, and the ratio of the upper junction $J_{sc}$ to the bottom subcell $J_{sc}$ is 139%.

The simplest manner to express the different embodiments of the present disclosure and their efficiency compared to that of the standard solar cell noted above is to list the embodiments with the specification of the composition of each successive subcell and their respective band gap, and then the computed efficiency.

Thus, for a four junction solar cell configured and described in the present disclosure, examples of embodiments of the present disclosure and their corresponding efficiency data at the end-of-life (EOL) are as follows:

| Embodiment 1 | Band Gap | Composition |
|---|---|---|
| Subcell A | 2.1 | AlInGaP |
| Subcell B | 1.73 | InGaP/AlInGaAs or AlInGaAs/AlInGaAs |
| Subcell C | 1.41 | (In)GaAs |
| Subcell D | 0.67 | Ge |

Efficiency at 70° C. after 5E14 $e/cm^2$ radiation: 24.5%
Efficiency at 70° C. after 1E14 $e/cm^2$ radiation: 23.5%

| Embodiment 2 | Band Gap | Composition |
|---|---|---|
| Subcell A | 2.1 | AlInGaP |
| Subcell B | 1.67 | InGaP/AlInGaAs or AlInGaAs/AlInGaAs |
| Subcell C | 1.34 | (In)GaAs |
| Subcell D | 0.67 | Ge |

Efficiency at 70° C. after 1E15 $e/cm^2$ radiation: 24.9%

| Embodiment 3 | Band Gap | Composition |
|---|---|---|
| Subcell A | 2.1 | AlInGaP |
| Subcell B | 1.65 | InGaP/AlInGaAs or AlInGaAs/AlInGaAs |
| Subcell C | 1.30 | (In)GaAs |
| Subcell D | 0.67 | Ge |

Efficiency at 70° C. after 1E15 $e/cm^2$ radiation: 25.3%

Although the above noted embodiments indicate the selection of composition and band gap, which results in the highest or optimum levels of efficiency are with subcell C having a band gap of 1.41, 1.34, or 1.30 eV, the present disclosure also encompasses the other embodiments noted above, and intermediate generalizations thereof, that may be more desirable for implementation in view of specific customer or application requirements and in which the maximum or optimum efficiency of the design is not a deciding factor for implementation of such a solar cell.

Aspects of the present disclosure also can applied, for example, to a five junction solar cell.

The four junction solar cell of the present disclosure has, in some instances, a slightly higher cell efficiency than the standard commercial solar cell (ZTJ) at BOL at 70° C. However, the solar cell in some embodiments described in the present disclosure exhibits substantially improved cell efficiency (%) over the standard commercial solar cell (ZTJ) at 1 MeV electron equivalent fluence of $5\times10^{14}$ e/cm$^2$, and dramatically improved cell efficiency (%) over the standard commercial solar cell (ZTJ) at 1 MeV electron equivalent fluence of $1\times10^{15}$ e/cm$^2$.

The wide range of electron and proton energies present in the space environment necessitates a method of describing the effects of various types of radiation in terms of a radiation environment which can be produced under laboratory conditions. The methods for estimating solar cell degradation in space are based on the techniques described by Brown et al. [Brown, W. L., J. D. Gabbe, and W. Rosenzweig, Results of the Telstar Radiation Experiments, Bell System Technical J., 42, 1505, 1963] and Tada [Tada, H. Y., J. R. Carter, Jr., B. E. Anspaugh, and R. G. Downing, Solar Cell Radiation Handbook, Third Edition, JPL Publication 82-69, 1982]. In summary, the omnidirectional space radiation is converted to a damage equivalent unidirectional fluence at a normalised energy and in terms of a specific radiation particle. This equivalent fluence will produce the same damage as that produced by omnidirectional space radiation considered when the relative damage coefficient (RDC) is properly defined to allow the conversion. The relative damage coefficients (RDCs) of a particular solar cell structure are measured a priori under many energy and fluence levels in addition to different coverglass thickness values. When the equivalent fluence is determined for a given space environment, the parameter degradation can be evaluated in the laboratory by irradiating the solar cell with the calculated fluence level of unidirectional normally incident flux. The equivalent fluence is normally expressed in terms of 1 MeV electrons or 10 MeV protons.

The software package Spenvis (www.spenvis.oma.be) is used to calculate the specific electron and proton fluence that a solar cell is exposed to during a specific satellite mission as defined by the duration, altitude, azimuth, etc. Spenvis employs the EQFLUX program, developed by the Jet Propulsion Laboratory (JPL) to calculate 1 MeV and 10 MeV damage equivalent electron and proton fluences, respectively, for exposure to the fluences predicted by the trapped radiation and solar proton models for a specified mission environment duration. The conversion to damage equivalent fluences is based on the relative damage coefficients determined for multijunction cells [Marvin, D. C., Assessment of Multijunction Solar Cell Performance in Radiation Environments, Aerospace Report No. TOR-2000 (1210)-1, 2000]. New cell structures eventually need new RDC measurements as different materials can be more or less damage resistant than materials used in conventional solar cells. A widely accepted total mission equivalent fluence for a geosynchronous satellite mission of 15 year duration is 1 MeV $1\times10^{15}$ electrons/cm$^2$.

It will be understood that each of the elements described above, or two or more together, also may find a useful application in other types of structures or constructions differing from the types of structures or constructions described above.

Although described embodiments of the present disclosure utilizes a vertical stack of three subcells, various aspects and features of the present disclosure can apply to stacks with fewer or greater number of subcells, i.e. two junction cells, three junction cells, five, six, seven junction cells, etc.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the solar cell described in the present disclosure may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the solar cell described in the present disclosure has been illustrated and described as embodied in a conventional multijunction solar cell, it is not intended to be limited to the details shown, since it is also applicable to inverted metamorphic solar cells, and various modifications and structural changes may be made without departing in any way from the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Various modifications may be made to the foregoing disclosure. Among other things, features described in different examples may, in some instances, be combined in the same implementation. Accordingly, other implementations also are within the scope of the claims.

What is claimed is:

1. A four junction solar cell comprising:
an upper first solar subcell composed of indium gallium aluminum phosphide and having a first band gap in the range of 1.85 to 2.2 eV;
a second solar subcell disposed adjacent to said first solar subcell and including an emitter layer composed of indium gallium phosphide or aluminum indium gallium arsenide, and a base layer composed of aluminum indium gallium arsenide and having a second band gap in the range of approximately 1.41 to 1.8 eV and being lattice matched with the upper first solar subcell, wherein the emitter and base layers form a photoelectric junction;
a third solar subcell adjacent to said second solar subcell and composed of indium gallium arsenide and having a third band gap less than that of the second solar subcell and being lattice matched with the second solar subcell;
a fourth solar subcell adjacent to said third solar subcell and composed of germanium and having a fourth band gap of approximately 0.67 eV; and
a distributed Bragg reflector (DBR) structure directly adjacent to and disposed between the third and the fourth solar subcells and compositionally graded to lattice match the third solar subcell on one side and the fourth solar subcell on the other side, the DBR structure being arranged so that light can enter and pass through the third solar subcell and at least a portion of which can be reflected back into the third solar subcell by the DBR structure, and is composed of a plurality of layers of materials with discontinuities in their respective indices of refraction, wherein the DBR structure includes a first portion composed of a plurality DBR layer pairs with either each successive pair or each successive two pairs having a gradation in lattice constant, and a second portion disposed over the first portion composed of a plurality of DBR layer pairs with a constant lattice constant.

2. A four junction solar cell as defined in claim 1, wherein the DBR layers in the first portion are composed of n or p type $In_zAl_yGa_{1-y-w}As$ and $In_zAl_xGa_{1-z-x}As$ layer pairs with the amount of indium in each pair increasing by approximately 3% in each graded step, where $0<w<1$, $0<y<1$, $0<z<1$.

3. A four junction solar cell as defined in claim 1, wherein the number of DBR layer pairs in the DBR structure is between 10 and 20.

4. A four junction solar cell as defined in claim 1, wherein the average band gap of all four solar subcells is equal to or greater than 1.35 eV wherein the average band gap is defined as the numerical average of the lowest band gap material that is used in each solar subcell.

5. A four junction solar cell as defined in claim 1, wherein the third solar subcell has a band gap in the range of 1.3 to 1.41 eV.

6. A four junction solar cell as defined in claim 1, wherein the upper first solar subcell is composed of a base layer of $(Al_xGa_{1-x})_{1-y}In_yP$, and an emitter layer of $(Al_xGa_{1-x})_{1-y}In_yP$.

7. A four junction solar cell as defined in claim 1, further comprising a tunnel diode disposed over the fourth solar subcell, with the DBR structure being disposed between the third solar subcell and the tunnel diode, wherein the DBR structure is compositionally graded to lattice match the third solar subcell on one side and the tunnel diode on the other side.

8. A four junction solar cell as defined in claim 1, wherein the first portion of the DBR structure is compositionally step-graded such that the band gap of the step graded layers of the first portion of the DBR structure is in the range of 1.15 to 1.41 eV throughout its thickness.

9. A four junction solar cell as defined in claim 1, wherein the first portion of the DBR structure has a graded band gap in the range of 1.15 to 1.41 eV.

10. A four junction solar cell as defined in claim 1, wherein each solar subcell includes a respective emitter region and base region, and one or more of the solar subcells includes:
a base region having a gradation in doping that increases exponentially from $1\times10^{15}$ atoms per cubic centimeter adjacent a p-n junction of the solar subcell to $4\times10^{18}$ atoms per cubic centimeter adjacent to an adjoining layer at a rear of the base; and
an emitter region having a gradation in doping that decreases from approximately $5\times10^{18}$ atoms per cubic centimeter in a semiconductor region immediately adjacent to said adjoining layer to $5\times10^{17}$ atoms per cubic centimeter in a region adjacent to the p-n junction of the solar subcell.

11. A four junction solar cell as defined in claim 1, wherein at least one upper sublayer of the second portion of the DBR structure has a larger lattice constant than a semiconductor layer adjacent to the upper sublayer disposed above the DBR structure.

12. A four junction solar cell as defined in claim 1, wherein a difference in lattice constant between the third and fourth solar subcells is in the range of 0.01 to 0.1 Angstroms.

13. A four junction solar cell as defined in claim 7, further comprising an inactive majority carrier layer disposed over the second or third solar subcell and having a lattice constant that is greater than that of the third and fourth solar subcells so that layers of the tunnel diode are strained in tension.

14. A four-junction solar cell as defined in claim 13 wherein the inactive majority carrier layer comprises at least one of a window, BSF, or tunnel diode layer.

15. A four junction solar cell as defined in claim 1, further comprising a threading dislocation inhibition layer having a thickness in the range of 0.10 to 1.0 micron and composed of InGa(Al)P, the threading dislocation inhibition layer being disposed over and directly adjacent to said DBR structure for reducing the propagation of threading dislocations, said threading dislocation inhibition layer having a composition different from a composition of the DBR structure.

16. A four junction solar cell as defined in claim 1, wherein
(i) the upper first solar subcell has a band gap of 2.10 eV;
(ii) the second solar subcell has a bandgap of 1.73 eV;
(iii) the third solar subcell has a band gap of 1.41 eV; and
(iv) the fourth solar subcell has a band gap of 0.67 eV;
or
(v) the upper first solar subcell has a band gap of 2.10 eV;
(vi) the second solar subcell has a bandgap of 1.63 eV;
(vii) the third solar subcell has a band gap of 1.335 or 1.311 or 1.3 or 1.289 eV; and
(viii) the fourth solar subcell has a band gap of 0.67 eV;
or
(ix) the upper first solar subcell has a band gap of 2.10 eV;
(x) the second solar subcell has a bandgap of 1.57 eV;

(xi) the third solar subcell has a band gap of 1.265 eV; and
(xii) the fourth solar subcell has a band gap of 0.67 eV;
or
(xiii) the upper first solar subcell has a band gap of 2.10 eV;
(xiv) the second solar subcell has a bandgap of 1.56 eV;
(xv) the third solar subcell has a band gap of 1.25 eV; and
(xvi) the fourth solar subcell has a band gap of 0.67 eV;
or
(xvii) the upper first solar subcell has a band gap of 2.10 eV;
(xviii) the second solar subcell has a bandgap of 1.73 eV;
(xix) the third solar subcell has a band gap of 1.42 eV; and
(xx) the fourth solar subcell has a band gap of 0.67 eV;
or
(xxi) the upper first solar subcell has a band gap of 2.10 eV;
(xxii) the second solar subcell has a bandgap of 1.55 eV;
(xxiii) the third solar subcell has a band gap of 1.197 eV; and
(xxiv) the fourth solar subcell has a band gap of 0.67 eV;
or
(xxv) the upper first solar subcell has a band gap of 2.10 eV;
(xxvi) the second solar subcell has a bandgap of 1.53 eV;
(xxvii) the third solar subcell has a band gap of 1.175 eV; and
(xxviii) the fourth solar subcell has a band gap of 0.67 eV;
or
(xxix) the upper first solar subcell has a band gap of 2.10 eV;
(xxx) the second solar subcell has a bandgap of 1.45 eV;
(xxxi) the third solar subcell has a band gap of 1.1 eV; and
(xxxii) the fourth solar subcell has a band gap of 0.67 eV.

17. A method of manufacturing a multijunction solar cell comprising:
providing a growth substrate;
forming a first solar subcell over or in the growth substrate;
growing a distributed Bragg reflector (DBR) structure over the growth substrate, wherein the DBR structure includes a first portion composed of a plurality DBR layer pairs with either each successive pair or each successive two pairs having a gradation in lattice constant, and a second portion composed of a plurality of DBR layer pairs with a constant lattice constant;
subsequently growing a sequence of layers of semiconductor material using a deposition process to form a solar cell comprising a plurality of solar subcells including the first solar subcell disposed over and lattice mismatched with respect to the growth substrate and having a band gap in the range of 0.9 to 1.6 eV, a second solar subcell disposed over the first solar subcell; and a third solar subcell over the second solar subcell; and
forming an upper solar subcell over the third solar subcell and having a band gap in the range of 1.95 to 2.20 eV,
wherein the DBR structure is composed of a plurality of sublayers disposed directly adjacent to the first solar subcell and the second solar subcell, at least some of the sublayers being compositionally graded to lattice match the growth substrate and first solar subcell on one side and the second solar subcell on the other side, and arranged so that light can enter and pass through the second solar subcell and at least a portion of which can be reflected back into the second solar subcell by the DBR structure, and at least some of the sublayers are composed of a plurality of layers of materials with discontinuities in their respective indices of refraction, the sublayers being composed of any of the As, P, N, Sb based III-V compound semiconductors subject to the constraint of having the in-plane lattice parameter throughout its thickness being greater than or equal to that of the growth substrate.

18. A method as defined in claim 17, wherein the DBR layers in the first portion of the DBR structure are composed of n or p type $In_zAl_yGa_{1-y-w}As$ and $In_zAl_xGa_{1-z-x}As$ layer pairs with the amount of indium in each pair increasing by approximately 3% in each graded step, where $0<w<1$, $0<y<1$, $0<z<1$.

19. A method as defined in claim 17, wherein the number of DBR layer pairs in the DBR structure is between 10 and 20.

* * * * *